United States Patent
Li et al.

(10) Patent No.: US 12,504,692 B2
(45) Date of Patent: Dec. 23, 2025

(54) CYCLIC DEVELOPMENT OF METAL OXIDE BASED PHOTORESIST FOR ETCH STOP DETERRENCE

(71) Applicant: Lam Research Corporation, Fremont, CA (US)

(72) Inventors: Da Li, Newark, CA (US); Ji Yeon Kim, Fremont, CA (US); Samantha S.H. Tan, Newark, CA (US); Timothy William Weidman, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 18/700,238

(22) PCT Filed: Jun. 29, 2023

(86) PCT No.: PCT/US2023/069419
§ 371 (c)(1),
(2) Date: Apr. 10, 2024

(87) PCT Pub. No.: WO2024/006938
PCT Pub. Date: Jan. 4, 2024

(65) Prior Publication Data
US 2024/0329538 A1    Oct. 3, 2024

Related U.S. Application Data

(60) Provisional application No. 63/367,584, filed on Jul. 1, 2022.

(51) Int. Cl.
*G03F 7/36* (2006.01)
*G03F 7/004* (2006.01)
*G03F 7/16* (2006.01)
*G03F 7/42* (2006.01)

(52) U.S. Cl.
CPC .............. *G03F 7/36* (2013.01); *G03F 7/0043* (2013.01); *G03F 7/168* (2013.01); *G03F 7/422* (2013.01)

(58) Field of Classification Search
CPC ........ G03F 7/36; G03F 7/0043; G03F 7/0044; G03F 7/26
See application file for complete search history.

(56) References Cited

U.S. PATENT DOCUMENTS

| | | |
|---|---|---|
| 4,061,829 A | 12/1977 | Taylor |
| 4,241,165 A | 12/1980 | Hughes et al. |
| 4,292,384 A | 9/1981 | Straughan et al. |
| 4,314,022 A | 2/1982 | Fisch |
| 4,341,592 A | 7/1982 | Shortes et al. |
| 4,396,704 A | 8/1983 | Taylor |
| 4,738,748 A | 4/1988 | Kisa |
| 4,806,456 A | 2/1989 | Katoh |
| 4,834,834 A | 5/1989 | Ehrlich et al. |
| 4,842,989 A | 6/1989 | Taniguchi et al. |
| 4,940,854 A | 7/1990 | Debe |
| 5,094,936 A | 3/1992 | Misium et al. |
| 5,206,706 A | 4/1993 | Quinn |
| 5,322,765 A | 6/1994 | Clecak et al. |
| 5,683,857 A | 11/1997 | Shirai et al. |
| 5,914,278 A | 6/1999 | Boitnott et al. |
| 5,925,494 A | 7/1999 | Horn |
| 6,013,418 A | 1/2000 | Ma et al. |
| 6,045,877 A | 4/2000 | Gleason et al. |
| 6,162,577 A | 12/2000 | Felter et al. |
| 6,179,922 B1 | 1/2001 | Ishikawa et al. |
| 6,179,924 B1 | 1/2001 | Zhao et al. |
| 6,183,934 B1 | 2/2001 | Kawamonzen |
| 6,290,779 B1 | 9/2001 | Saleh et al. |
| 6,319,654 B1 | 11/2001 | Kim et al. |
| 6,448,097 B1 | 9/2002 | Singh et al. |
| 6,566,276 B2 | 5/2003 | Maloney et al. |
| 6,573,030 B1 | 6/2003 | Fairbairn et al. |
| 6,607,867 B1 | 8/2003 | Kim et al. |
| 6,666,986 B1 | 12/2003 | Vaartstra |
| 6,841,341 B2 | 1/2005 | Fairbairn et al. |
| 6,867,086 B1 | 3/2005 | Chen et al. |
| 7,112,489 B1 | 9/2006 | Lyons et al. |
| 7,169,440 B2 | 1/2007 | Balasubramaniam et al. |
| 7,223,526 B2 | 5/2007 | Fairbairn et al. |

(Continued)

FOREIGN PATENT DOCUMENTS

| | | |
|---|---|---|
| CN | 1841201 A | 10/2006 |
| CN | 102027577 A | 4/2011 |

(Continued)

OTHER PUBLICATIONS

Cardineau, B. et al., "EUV Resists Based on Tin-oxo Clusters", Advances in Patterning Materials and Processes XXXI, Proceedings Of Spie, Apr. 4, 2014, vol. 9051, pp. 335-346.
CN Office Action dated Apr. 22, 2024 in CN Application No. 201980085227.1 with English translation.
CN Office Action dated Dec. 13, 2023 in CN Application No. 201810783756.6 with English translation.
CN Office Action dated Jan. 3, 2024 in CN Application No. 202310318757.4 with English Translation.
CN Office Action dated Jan. 23, 2024 in CN Application No. 202080046943.1 with English Translation.
CN Office Action dated Jul. 23, 2024 in CN Application No. 201810783756.6 with English translation.

(Continued)

Primary Examiner — Daborah Chacko-Davis
(74) Attorney, Agent, or Firm — Weaver Austin Villeneuve & Sampson LLP

(57) ABSTRACT

Provided are processes for development of photopatterned metal or metal oxide-based thin film photoresists post-EUV exposure for removal of non-volatile species and deterring etch stop. Repeated cycles of alternating treatment with an etchant and an oxidizing agent; or treatment with an etchant followed by treatment with a wash agent are effective techniques for removal of the undesired unexposed portion of a photoresist.

28 Claims, 10 Drawing Sheets

(56) References Cited

U.S. PATENT DOCUMENTS

| | | |
|---|---|---|
| 7,307,695 B2 | 12/2007 | Hazenberg et al. |
| 7,335,462 B2 | 2/2008 | Fairbairn et al. |
| 7,438,534 B2 | 10/2008 | Holland et al. |
| 7,608,367 B1 | 10/2009 | Aigeldinger et al. |
| 8,083,862 B2 | 12/2011 | Brown |
| 8,536,068 B2 | 9/2013 | Weidman et al. |
| 8,703,386 B2 | 4/2014 | Bass et al. |
| 8,883,405 B2 | 11/2014 | Shiobara |
| 9,310,684 B2 | 4/2016 | Meyers et al. |
| 9,632,411 B2 | 4/2017 | Michaelson et al. |
| 9,735,002 B2 | 8/2017 | Kawaguchi et al. |
| 9,778,561 B2 | 10/2017 | Marks et al. |
| 9,790,595 B2 | 10/2017 | Jung et al. |
| 9,823,564 B2 | 11/2017 | Stowers et al. |
| 9,996,004 B2 | 6/2018 | Smith et al. |
| 10,025,179 B2 | 7/2018 | Meyers et al. |
| 10,074,543 B2 | 9/2018 | Mahorowala et al. |
| 10,228,618 B2 | 3/2019 | Meyers et al. |
| 10,304,668 B2 | 5/2019 | Coppa et al. |
| 10,416,554 B2 | 9/2019 | Meyers et al. |
| 10,514,598 B2 | 12/2019 | Marks et al. |
| 10,515,812 B1 | 12/2019 | Wang et al. |
| 10,627,719 B2 | 4/2020 | Waller et al. |
| 10,642,153 B2 | 5/2020 | Meyers et al. |
| 10,649,328 B2 | 5/2020 | Stowers et al. |
| 10,679,843 B2 | 6/2020 | Jeong et al. |
| 10,732,505 B1 | 8/2020 | Meyers et al. |
| 10,775,696 B2 | 9/2020 | Meyers et al. |
| 10,782,610 B2 | 9/2020 | Stowers et al. |
| 10,787,466 B2 | 9/2020 | Edson et al. |
| 10,815,391 B2 | 10/2020 | Lee et al. |
| 10,831,096 B2 | 11/2020 | Marks et al. |
| 11,079,682 B1 | 8/2021 | Han et al. |
| 11,209,729 B2 | 12/2021 | Marks et al. |
| 11,314,168 B2 | 4/2022 | Tan et al. |
| 11,462,417 B2 | 10/2022 | Delmas et al. |
| 11,988,965 B2 | 5/2024 | Tan et al. |
| 12,105,422 B2 | 10/2024 | Tan et al. |
| 12,183,604 B2 | 12/2024 | Yu et al. |
| 12,211,691 B2 | 1/2025 | Volosskiy et al. |
| 12,278,125 B2 | 4/2025 | Yu et al. |
| 12,346,035 B2 | 7/2025 | Dictus et al. |
| 2001/0055731 A1 | 12/2001 | Irie |
| 2002/0017243 A1 | 2/2002 | Pyo |
| 2003/0008246 A1 | 1/2003 | Cheng et al. |
| 2003/0027060 A1 | 2/2003 | Lederer |
| 2003/0134231 A1 | 7/2003 | Tsai et al. |
| 2003/0183244 A1 | 10/2003 | Rossman |
| 2004/0067444 A1 | 4/2004 | Wakabayashi et al. |
| 2004/0097388 A1 | 5/2004 | Brask et al. |
| 2004/0115956 A1 | 6/2004 | Ishida |
| 2004/0178076 A1* | 9/2004 | Stonas ............ G01N 33/54346 205/74 |
| 2004/0191423 A1 | 9/2004 | Ruan et al. |
| 2004/0213563 A1 | 10/2004 | Irie |
| 2004/0229169 A1 | 11/2004 | Sandstrom |
| 2004/0233401 A1 | 11/2004 | Irie |
| 2005/0142885 A1 | 6/2005 | Shinriki |
| 2006/0001064 A1 | 1/2006 | Hill et al. |
| 2006/0046470 A1 | 3/2006 | Becknell et al. |
| 2006/0068173 A1 | 3/2006 | Kajiyama et al. |
| 2006/0151462 A1 | 7/2006 | Lee et al. |
| 2006/0166537 A1 | 7/2006 | Thompson et al. |
| 2006/0228897 A1 | 10/2006 | Timans |
| 2006/0287207 A1 | 12/2006 | Park et al. |
| 2007/0017386 A1 | 1/2007 | Kamei |
| 2007/0287073 A1 | 12/2007 | Goodwin |
| 2009/0134119 A1 | 5/2009 | Matsumaru et al. |
| 2009/0197086 A1 | 8/2009 | Rathi et al. |
| 2009/0325387 A1 | 12/2009 | Chen et al. |
| 2010/0009274 A1 | 1/2010 | Yamamoto |
| 2010/0068660 A1 | 3/2010 | Shibazaki et al. |
| 2010/0086880 A1 | 4/2010 | Saito et al. |
| 2010/0131093 A1 | 5/2010 | Yokoyama et al. |
| 2010/0216310 A1 | 8/2010 | Metz et al. |
| 2010/0310790 A1 | 12/2010 | Chang et al. |
| 2011/0117702 A1 | 5/2011 | Rietzler et al. |
| 2011/0195142 A1 | 8/2011 | Mitamura et al. |
| 2011/0198756 A1 | 8/2011 | Thenappan et al. |
| 2011/0200953 A1 | 8/2011 | Arima et al. |
| 2011/0209725 A1 | 9/2011 | Kim et al. |
| 2011/0242508 A1 | 10/2011 | Kobayashi |
| 2011/0244680 A1 | 10/2011 | Tohnoe et al. |
| 2011/0266252 A1 | 11/2011 | Thadani et al. |
| 2011/0277681 A1 | 11/2011 | Arena et al. |
| 2011/0292356 A1 | 12/2011 | Tsukinoki et al. |
| 2012/0088193 A1 | 4/2012 | Weidman et al. |
| 2012/0088369 A1 | 4/2012 | Weidman et al. |
| 2012/0090547 A1 | 4/2012 | Wang et al. |
| 2012/0202357 A1 | 8/2012 | Sato et al. |
| 2012/0208125 A1 | 8/2012 | Hatakeyama |
| 2012/0322011 A1 | 12/2012 | Wu et al. |
| 2013/0129995 A1 | 5/2013 | Ouattara et al. |
| 2013/0157177 A1 | 6/2013 | Yu et al. |
| 2013/0183609 A1 | 7/2013 | Seon et al. |
| 2013/0224652 A1 | 8/2013 | Bass et al. |
| 2013/0299089 A1 | 11/2013 | Kim et al. |
| 2013/0323652 A1 | 12/2013 | Fernandez et al. |
| 2013/0330928 A1 | 12/2013 | Ishikawa et al. |
| 2014/0014745 A1 | 1/2014 | Burrows et al. |
| 2014/0021673 A1 | 1/2014 | Chen et al. |
| 2014/0209015 A1 | 7/2014 | Yamada et al. |
| 2014/0255844 A1 | 9/2014 | Iwao et al. |
| 2014/0263172 A1 | 9/2014 | Xie et al. |
| 2014/0268082 A1 | 9/2014 | Michaelson et al. |
| 2014/0272726 A1 | 9/2014 | Chang |
| 2015/0020848 A1 | 1/2015 | Kim et al. |
| 2015/0056542 A1 | 2/2015 | Meyers et al. |
| 2015/0096683 A1 | 4/2015 | Deshmukh et al. |
| 2015/0152551 A1 | 6/2015 | Yamaguchi et al. |
| 2015/0221519 A1 | 8/2015 | Marks et al. |
| 2015/0270148 A1 | 9/2015 | Shinoda et al. |
| 2015/0303064 A1 | 10/2015 | Singer et al. |
| 2015/0355549 A1 | 12/2015 | Xie et al. |
| 2016/0011505 A1 | 1/2016 | Stowers et al. |
| 2016/0011516 A1 | 1/2016 | Devilliers |
| 2016/0021660 A1 | 1/2016 | Krishnamurthy |
| 2016/0041471 A1 | 2/2016 | Briend et al. |
| 2016/0086864 A1 | 3/2016 | Fischer et al. |
| 2016/0116839 A1 | 4/2016 | Meyers et al. |
| 2016/0126106 A1 | 5/2016 | Shimizu et al. |
| 2016/0216606 A1 | 7/2016 | Meyers et al. |
| 2016/0260588 A1 | 9/2016 | Park et al. |
| 2016/0284559 A1 | 9/2016 | Kikuchi et al. |
| 2016/0343544 A1 | 11/2016 | Watanabe et al. |
| 2016/0357107 A1 | 12/2016 | Buchberger, Jr. et al. |
| 2017/0004974 A1 | 1/2017 | Manna et al. |
| 2017/0010535 A1 | 1/2017 | Fujitani et al. |
| 2017/0018506 A1 | 1/2017 | Cao et al. |
| 2017/0092495 A1 | 3/2017 | Chen et al. |
| 2017/0097569 A1 | 4/2017 | Yang et al. |
| 2017/0102612 A1 | 4/2017 | Meyers et al. |
| 2017/0146909 A1 | 5/2017 | Smith et al. |
| 2017/0154766 A1 | 6/2017 | Ogihara et al. |
| 2017/0168398 A1 | 6/2017 | Zi et al. |
| 2017/0176858 A1 | 6/2017 | Hirano |
| 2017/0229325 A1 | 8/2017 | Lubomirsky et al. |
| 2017/0261850 A1 | 9/2017 | Stowers et al. |
| 2017/0342553 A1 | 11/2017 | Yu et al. |
| 2018/0023192 A1 | 1/2018 | Chandra et al. |
| 2018/0039172 A1 | 2/2018 | Stowers et al. |
| 2018/0039182 A1 | 2/2018 | Zi et al. |
| 2018/0046086 A1 | 2/2018 | Waller et al. |
| 2018/0093306 A1 | 4/2018 | Kang et al. |
| 2018/0122648 A1 | 5/2018 | Kim et al. |
| 2018/0164689 A1 | 6/2018 | Sano et al. |
| 2018/0166278 A1 | 6/2018 | Belyansky et al. |
| 2018/0173096 A1 | 6/2018 | Zi et al. |
| 2018/0224744 A1 | 8/2018 | Bae et al. |
| 2018/0233362 A1 | 8/2018 | Glodde et al. |
| 2018/0307137 A1 | 10/2018 | Meyers et al. |
| 2018/0308687 A1 | 10/2018 | Smith et al. |
| 2018/0314167 A1 | 11/2018 | Chang et al. |
| 2018/0323064 A1 | 11/2018 | Jung et al. |

(56) References Cited

U.S. PATENT DOCUMENTS

| | | |
|---|---|---|
| 2018/0354804 A1 | 12/2018 | Venkatasubramania et al. |
| 2018/0356731 A1 | 12/2018 | Tagawa |
| 2019/0041755 A1 | 2/2019 | Tanaka et al. |
| 2019/0129307 A1 | 5/2019 | Kwon et al. |
| 2019/0131130 A1 | 5/2019 | Smith et al. |
| 2019/0137870 A1 | 5/2019 | Meyers et al. |
| 2019/0146337 A1 | 5/2019 | Zi et al. |
| 2019/0153001 A1 | 5/2019 | Cardineau et al. |
| 2019/0163056 A1 | 5/2019 | Maes et al. |
| 2019/0172714 A1 | 6/2019 | Bobek et al. |
| 2019/0187556 A1 | 6/2019 | Park et al. |
| 2019/0244809 A1 | 8/2019 | Ono |
| 2019/0259601 A1 | 8/2019 | De Silva et al. |
| 2019/0308998 A1 | 10/2019 | Cardineau et al. |
| 2019/0315781 A1 | 10/2019 | Edson et al. |
| 2019/0315782 A1 | 10/2019 | Edson et al. |
| 2019/0332014 A1 | 10/2019 | Ookubo et al. |
| 2019/0333777 A1 | 10/2019 | Hsieh et al. |
| 2019/0352776 A1 | 11/2019 | Parikh |
| 2019/0369489 A1 | 12/2019 | Meyers et al. |
| 2019/0378696 A1 | 12/2019 | Addepalli et al. |
| 2019/0391486 A1 | 12/2019 | Jiang et al. |
| 2020/0041897 A1 | 2/2020 | Moon et al. |
| 2020/0041901 A1 | 2/2020 | Namgung et al. |
| 2020/0064733 A1 | 2/2020 | Meyers et al. |
| 2020/0066536 A1 | 2/2020 | Yaegashi |
| 2020/0089104 A1 | 3/2020 | Marks et al. |
| 2020/0124970 A1 | 4/2020 | Kocsis et al. |
| 2020/0133133 A1 | 4/2020 | Park et al. |
| 2020/0166845 A1 | 5/2020 | Berendsen et al. |
| 2020/0174374 A1 | 6/2020 | Liao et al. |
| 2020/0176246 A1 | 6/2020 | Huotari et al. |
| 2020/0209756 A1 | 7/2020 | Waller et al. |
| 2020/0239498 A1 | 7/2020 | Clark et al. |
| 2020/0241413 A1 | 7/2020 | Clark et al. |
| 2020/0257196 A1 | 8/2020 | Meyers et al. |
| 2020/0292937 A1 | 9/2020 | Stowers et al. |
| 2020/0326627 A1 | 10/2020 | Jiang et al. |
| 2020/0393765 A1 | 12/2020 | Sakanishi |
| 2021/0013034 A1 | 1/2021 | Wu et al. |
| 2021/0271170 A1 | 9/2021 | Telecky et al. |
| 2021/0287909 A1 | 9/2021 | Zhou et al. |
| 2021/0302833 A1 | 9/2021 | Weng et al. |
| 2021/0305040 A1 | 9/2021 | Kuo et al. |
| 2021/0397085 A1 | 12/2021 | Weidman et al. |
| 2022/0002882 A1 | 1/2022 | Kalutarage et al. |
| 2022/0020584 A1 | 1/2022 | Volosskiy et al. |
| 2022/0028684 A1 | 1/2022 | Chen et al. |
| 2022/0035247 A1 | 2/2022 | Tan et al. |
| 2022/0043334 A1 | 2/2022 | Tan et al. |
| 2022/0059362 A1 | 2/2022 | Li et al. |
| 2022/0075260 A1 | 3/2022 | Marks et al. |
| 2022/0244645 A1 | 8/2022 | Tan et al. |
| 2022/0299877 A1 | 9/2022 | Weidman et al. |
| 2022/0308454 A1 | 9/2022 | Weidman et al. |
| 2022/0308462 A1 | 9/2022 | Berney et al. |
| 2022/0342301 A1 | 10/2022 | Weidman et al. |
| 2022/0344136 A1 | 10/2022 | Peter et al. |
| 2022/0359280 A1 | 11/2022 | Yang et al. |
| 2022/0365434 A1 | 11/2022 | Nardi et al. |
| 2022/0404713 A1 | 12/2022 | Tapily |
| 2023/0031955 A1 | 2/2023 | Yu et al. |
| 2023/0045336 A1 | 2/2023 | Yu et al. |
| 2023/0078946 A1 | 3/2023 | Grzeskowiak et al. |
| 2023/0100995 A1 | 3/2023 | Cardineau et al. |
| 2023/0107357 A1 | 4/2023 | Dictus et al. |
| 2023/0126516 A1 | 4/2023 | Wang et al. |
| 2023/0152701 A1 | 5/2023 | Kanakasabapathy |
| 2023/0259025 A1 | 8/2023 | Hansen et al. |
| 2023/0266662 A1 | 8/2023 | Marks et al. |
| 2023/0266664 A1 | 8/2023 | Hansen et al. |
| 2023/0266670 A1 | 8/2023 | Hansen et al. |
| 2023/0273516 A1 | 8/2023 | Marks et al. |
| 2023/0288798 A1 | 9/2023 | Hansen et al. |
| 2023/0290657 A1 | 9/2023 | Yu et al. |
| 2023/0314946 A1 | 10/2023 | Hansen et al. |
| 2023/0314954 A1 | 10/2023 | Peter et al. |
| 2023/0341781 A1 | 10/2023 | Han et al. |
| 2023/0416606 A1 | 12/2023 | Dictus et al. |
| 2024/0027900 A1 | 1/2024 | Hajibabaeinajafabadi et al. |
| 2024/0036473 A1 | 2/2024 | Fujimoto et al. |
| 2024/0036483 A1 | 2/2024 | Dictus et al. |
| 2024/0045337 A1 | 2/2024 | Hajibabaeinajafabadi et al. |
| 2024/0053684 A1 | 2/2024 | Hajibabaeinajafabadi et al. |
| 2024/0145272 A1 | 5/2024 | Yu et al. |
| 2024/0355650 A1 | 10/2024 | Kanakasabapathy et al. |
| 2024/0361696 A1 | 10/2024 | Tan et al. |
| 2024/0419078 A1 | 12/2024 | Tan et al. |
| 2025/0053080 A1 | 2/2025 | Marks et al. |
| 2025/0053084 A1 | 2/2025 | Hansen et al. |
| 2025/0053092 A1 | 2/2025 | Kenane et al. |
| 2025/0060673 A1 | 2/2025 | Wu et al. |
| 2025/0060674 A1 | 2/2025 | Li et al. |
| 2025/0093781 A1 | 3/2025 | Peter et al. |
| 2025/0112045 A1 | 4/2025 | Volosskiy et al. |
| 2025/0244672 A1 | 7/2025 | Weidman et al. |
| 2025/0244677 A1 | 7/2025 | Li et al. |
| 2025/0244678 A1 | 7/2025 | Lee et al. |
| 2025/0246460 A1 | 7/2025 | Yu et al. |
| 2025/0250485 A1 | 8/2025 | Dictus et al. |
| 2025/0271766 A1 | 8/2025 | Hansen et al. |
| 2025/0271782 A1 | 8/2025 | Dictus et al. |
| 2025/0291255 A1 | 9/2025 | Lee et al. |

FOREIGN PATENT DOCUMENTS

| | | |
|---|---|---|
| CN | 102610516 A | 7/2012 |
| CN | 102834902 A | 12/2012 |
| CN | 103943493 A | 7/2014 |
| CN | 105047541 A | 11/2015 |
| CN | 105579906 A | 5/2016 |
| CN | 106876251 A | 6/2017 |
| CN | 108351594 A | 7/2018 |
| CN | 108388079 A | 8/2018 |
| CN | 108780739 A | 11/2018 |
| CN | 109521657 A | 3/2019 |
| CN | 109976097 A | 7/2019 |
| CN | 110609441 A | 12/2019 |
| CN | 111254416 A | 6/2020 |
| CN | 111258190 A | 6/2020 |
| EP | 0197286 A2 | 10/1986 |
| EP | 0197286 B1 | 9/1991 |
| EP | 0465064 A2 | 1/1992 |
| EP | 1123423 B1 | 8/2007 |
| EP | 3230294 A1 | 10/2017 |
| JP | S5119974 A | 2/1976 |
| JP | S57205736 A | 12/1982 |
| JP | S5883847 A | 5/1983 |
| JP | S58108744 A | 6/1983 |
| JP | S6112653 U | 1/1986 |
| JP | S61234035 A | 10/1986 |
| JP | H04226462 A | 8/1992 |
| JP | H0637050 A | 2/1994 |
| JP | H06169021 A | 6/1994 |
| JP | H06232041 A | 8/1994 |
| JP | H07106224 A | 4/1995 |
| JP | H07161607 A | 6/1995 |
| JP | H07244386 A | 9/1995 |
| JP | H0869959 A | 3/1996 |
| JP | H08316237 A | 11/1996 |
| JP | H08339950 A | 12/1996 |
| JP | H09172022 A | 6/1997 |
| JP | H1041206 A | 2/1998 |
| JP | H10209133 A | 8/1998 |
| JP | H10301298 A | 11/1998 |
| JP | H11119440 A | 4/1999 |
| JP | 2000305273 A | 11/2000 |
| JP | 2000347413 A | 12/2000 |
| JP | 2000356857 A | 12/2000 |
| JP | 2002100558 A | 4/2002 |
| JP | 2002118096 A | 4/2002 |
| JP | 2003131364 A | 5/2003 |
| JP | 2003280155 A | 10/2003 |
| JP | 2004510321 A | 4/2004 |

(56) References Cited

FOREIGN PATENT DOCUMENTS

| | | |
|---|---|---|
| JP | 2004513515 A | 4/2004 |
| JP | 2004259786 A | 9/2004 |
| JP | 2005260015 A | 9/2005 |
| JP | 2006310681 A | 11/2006 |
| JP | 2007027617 A | 2/2007 |
| JP | 2009192350 A | 8/2009 |
| JP | 2009212404 A | 9/2009 |
| JP | 2010016314 A | 1/2010 |
| JP | 2010500762 A | 1/2010 |
| JP | 2010067979 A | 3/2010 |
| JP | 2010123732 A | 6/2010 |
| JP | 2010531931 A | 9/2010 |
| JP | 2010239087 A | 10/2010 |
| JP | 2012142481 A | 7/2012 |
| JP | 2012173315 A | 9/2012 |
| JP | 5055743 B2 | 10/2012 |
| JP | 2012191242 A | 10/2012 |
| JP | 2013033291 A | 2/2013 |
| JP | 2013047848 A | 3/2013 |
| JP | 2013096011 A | 5/2013 |
| JP | 2013542944 A | 11/2013 |
| JP | 2014504004 A | 2/2014 |
| JP | 5544914 B2 | 7/2014 |
| JP | 2015504604 A | 2/2015 |
| JP | 5705103 B2 | 4/2015 |
| JP | 2015106640 A | 6/2015 |
| JP | 2016072557 A | 5/2016 |
| JP | 2016530565 A | 9/2016 |
| JP | 2017045869 A | 3/2017 |
| JP | 2017108053 A | 6/2017 |
| JP | 2017116923 A | 6/2017 |
| JP | 2017152689 A | 8/2017 |
| JP | 2017532407 A | 11/2017 |
| JP | 2018502173 A | 1/2018 |
| JP | 2018518688 A | 7/2018 |
| JP | 2018164076 A | 10/2018 |
| JP | 2018-200930 | 12/2018 |
| JP | 2019500490 A | 1/2019 |
| JP | 2019024129 A | 2/2019 |
| JP | 2019506730 A | 3/2019 |
| JP | 2019056730 A | 4/2019 |
| JP | 2019135755 A | 8/2019 |
| JP | 2019192814 A | 10/2019 |
| JP | 2019532182 A | 11/2019 |
| JP | 2021523403 A | 9/2021 |
| JP | 2022502714 A | 1/2022 |
| KR | 890015374 A | 10/1989 |
| KR | 900001238 B1 | 3/1990 |
| KR | 950001406 A | 1/1995 |
| KR | 960000375 B1 | 1/1996 |
| KR | 19990029141 A | 4/1999 |
| KR | 19990070327 A | 9/1999 |
| KR | 20000073111 A | 12/2000 |
| KR | 20020000292 A | 1/2002 |
| KR | 20050112115 A | 11/2005 |
| KR | 100575847 B1 | 5/2006 |
| KR | 20070003657 A | 1/2007 |
| KR | 20080046577 A | 5/2008 |
| KR | 20100090643 A | 8/2010 |
| KR | 20110007192 A | 1/2011 |
| KR | 20110009739 A | 1/2011 |
| KR | 20120078672 A | 7/2012 |
| KR | 20120093781 A | 8/2012 |
| KR | 20130007389 A | 1/2013 |
| KR | 20140047120 A | 4/2014 |
| KR | 101426105 B1 | 8/2014 |
| KR | 20140106442 A | 9/2014 |
| KR | 20140109816 A | 9/2014 |
| KR | 20150008065 A | 1/2015 |
| KR | 20150091260 A | 8/2015 |
| KR | 20150127145 A | 11/2015 |
| KR | 20150129781 A | 11/2015 |
| KR | 20150143480 A | 12/2015 |
| KR | 20160035995 A | 4/2016 |
| KR | 20160082969 A | 7/2016 |
| KR | 20170066218 A | 6/2017 |
| KR | 20180036263 A | 4/2018 |
| KR | 20180054917 A | 5/2018 |
| KR | 20180116438 A | 10/2018 |
| KR | 20180119471 A | 11/2018 |
| KR | 20210015639 A | 2/2021 |
| KR | 10-2021-0142118 | 11/2021 |
| KR | 20220025020 A | 3/2022 |
| KR | 20220130783 A | 9/2022 |
| KR | 20230029977 A | 3/2023 |
| TW | 200504864 A | 2/2005 |
| TW | 200846333 A | 12/2008 |
| TW | 200903686 A | 1/2009 |
| TW | 200947117 A | 11/2009 |
| TW | 201005568 A | 2/2010 |
| TW | 201145383 A | 12/2011 |
| TW | 201224190 A | 6/2012 |
| TW | I365354 B | 6/2012 |
| TW | 201241555 A | 10/2012 |
| TW | 201245918 A | 11/2012 |
| TW | 201246273 A | 11/2012 |
| TW | 201501179 A | 1/2015 |
| TW | I494689 B | 8/2015 |
| TW | 201631377 A | 9/2016 |
| TW | 201729006 A | 8/2017 |
| TW | 201734025 A | 10/2017 |
| TW | 201826034 A | 7/2018 |
| TW | 201830472 A | 8/2018 |
| TW | 201837066 A | 10/2018 |
| TW | 201931011 A | 8/2019 |
| TW | 202001407 A | 1/2020 |
| TW | 202006168 A | 2/2020 |
| WO | WO-2004095551 A1 | 11/2004 |
| WO | WO-2007123539 A1 | 11/2007 |
| WO | WO-2008019362 A2 | 2/2008 |
| WO | WO-2008088076 A1 | 7/2008 |
| WO | WO-2011081151 A1 | 7/2011 |
| WO | WO-2012075249 A1 | 6/2012 |
| WO | WO-2012048094 A3 | 7/2012 |
| WO | WO-2013078211 A1 | 5/2013 |
| WO | WO-2014172142 A1 | 10/2014 |
| WO | WO-2016065120 A1 | 4/2016 |
| WO | WO-2016144960 A1 | 9/2016 |
| WO | WO-2016208300 A1 | 12/2016 |
| WO | WO-2017002497 A1 | 1/2017 |
| WO | WO-2017066319 A2 | 4/2017 |
| WO | WO-2017109040 A1 | 6/2017 |
| WO | WO-2017198418 A1 | 11/2017 |
| WO | WO-2018004551 A1 | 1/2018 |
| WO | WO-2018004646 A1 | 1/2018 |
| WO | WO-2018061670 A1 | 4/2018 |
| WO | WO-2018189413 A1 | 10/2018 |
| WO | WO-2019163455 A1 | 8/2019 |
| WO | WO-2019217749 A1 | 11/2019 |
| WO | WO-2019222320 A1 | 11/2019 |
| WO | WO-2019241402 A1 | 12/2019 |
| WO | WO-2020014179 A1 | 1/2020 |
| WO | WO-2020030855 A2 | 2/2020 |
| WO | WO-2020102085 A1 | 5/2020 |
| WO | WO-2020132281 A1 | 6/2020 |
| WO | WO-2020190941 A1 | 9/2020 |
| WO | WO 2020-264158 | 12/2020 |
| WO | WO-2020263750 A1 | 12/2020 |
| WO | WO-2020264571 A1 | 12/2020 |
| WO | WO-2021072042 A1 | 4/2021 |
| WO | WO-2021202681 A1 | 10/2021 |
| WO | WO 2021-262529 | 12/2021 |
| WO | WO-2022005808 A1 | 1/2022 |
| WO | WO-2022103764 A1 | 5/2022 |
| WO | WO-2022103949 A1 | 5/2022 |
| WO | WO-2022125388 A1 | 6/2022 |

OTHER PUBLICATIONS

CN Office Action dated Jun. 1, 2023, in application No. CN201810783756 with English translation.
CN Office Action dated Jun. 8, 2022 in Application No. CN202180002531.2 With English Translation.

(56) References Cited

OTHER PUBLICATIONS

CN Office Action dated Mar. 14, 2024 in CN Application No. 201810783756.6, with English Translation.
CN Office Action dated Nov. 16, 2022, in Application No. CN202180002531.2 with English translation.
CN Office Action dated Nov. 18, 2022, in Application No. CN201810783756.6 with English Translation.
CN Office Action dated Sep. 14, 2024 in CN Application No. 202310318757.4 with English translation.
CN Office Action dated Sep. 23, 2024 in CN Application No. 202080046943.1 with English translation.
Dahuang, D., et al., Functional Thin Films and Their Deposition Preparation Techniques, Metallurgy Industrial Press, Jan. 31, 2013, pp. 450-454. [with English Translation].
Danilo D.E., et al., "Metal Containing Resist Readiness for HVM EUV Lithography", Journal of Photopolymer Science and Technology, 2016, vol. 29(3), pp. 501-507.
EP Extended European Search Report dated Jul. 13, 2023, in Application No. EP20831843.6.
EP Extended European Search report dated Nov. 29, 2023 in EP Application No. 23173688.5.
EP Extended European Search report dated Oct. 25, 2023, in Application No. EP21837274.6.
EP Partial European Search Report dated Aug. 29, 2023, in Application No. 23173688.5.
European Search Report dated Feb. 15, 2022, in Application No. EP21741104.
European Office Action dated Feb. 25, 2022 in Application No. 21741104.
Extended European Search Report dated Dec. 23, 2021, in Application No. EP19800353.5.
Hamley, I.W., "Nanostructure fabrication using block copolymers", Nanotechnology. Sep. 2003. 17;14(10):R39-R54.
Hench, L.L. and West, J.K., "The sol-gel process," Chemical reviews, Jan. 1, 1990; 90(1) pp. 33-72.
International Preliminary Report on Patentability dated Oct. 13, 2022, in PCT Application No. PCT/US2021/023493.
International Search Report and Written Opinion dated Aug. 4, 2021, in PCT Application No. PCT/US2021/023493.
International Search Report and Written Opinion dated Mar. 4, 2022, in Application No. PCT/US2021/058647.
International Preliminary Report on Patentability dated May 27, 2021 issued in Application No. PCT/US2019/060742.
International Search Report and Written Opinion dated May 17, 2021 issued in Application No. PCT/US2021/015656.
International Preliminary Report on Patentability and Written Opinion dated Dec. 28, 2023 in PCT Application No. PCT/US2022/033488.
International Preliminary Report on Patentability and Written Opinion dated Feb. 8, 2024 in PCT Application No. PCT/US2022/037733.
International Preliminary Report on Patentability and Written Opinion dated Jun. 27, 2024 in PCT Application No. PCT/US2022/081376.
International Preliminary Report on Patentability and Written Opinion dated Jun. 27, 2024 in PCT Application No. PCT/US2022/081390.
International Preliminary Report on Patentability and Written Opinion dated Jun. 27, 2024 in PCT Application No. PCT/US2022/081845.
International Preliminary Report on Patentability dated Apr. 14, 2022 issued in Application No. PCT/US2020/053856.
International Preliminary Report on Patentability dated Aug. 18, 2022 in PCT Application No. PCT/US2021/015656.
International Preliminary Report on Patentability dated Jan. 27, 2021 in Application PCT/US2020/054730.
International Preliminary Report on Patentability dated Jan. 5, 2023 in PCT Application No. PCT/US2021/034019.
International Preliminary Report on Patentability dated Jan. 5, 2023 in PCT Application No. PCT/US2021/037924.
International Preliminary Report on Patentability dated Jan. 19, 2023 in PCT Application No. PCT/US2021/040381.
International Preliminary Report on Patentability dated Jan. 26, 2023 in PCT Application No. PCT/US2021/042106.
International Preliminary Report on Patentability dated Jan. 6, 2022 in PCT Application No. PCT/US2020/038968.
International Preliminary Report on Patentability dated Jan. 6, 2022 in PCT Application No. PCT/US2020/039615.
International Preliminary Report on Patentability dated Jan. 6, 2022 in PCT Application No. PCT/US2020/070171.
International Preliminary Report on Patentability dated Jan. 6, 2022 in PCT Application No. PCT/US2020/070172.
International Preliminary Report on Patentability dated Jan. 6, 2022 in PCT Application No. PCT/US2020/070187.
International Preliminary Report on Patentability dated Jul. 28, 2022 in PCT Application No. PCT/US2021/012953.
International Preliminary Report on Patentability dated Jun. 22, 2023, in Application No. PCT/US2021/061751.
International Preliminary Report on Patentability dated May 25, 2023, in Application No. PCT/US2021/058647.
International Search Report and Written Opinion dated May 12, 2021 issued in Application No. PCT/US2021/012953.
International Search Report and Written Opinion dated Apr. 10, 2020 issued in Application No. PCT/US2019/060742.
International Search Report and Written Opinion dated Apr. 17, 2023, in Application No. PCT/US2022/081390.
International Search Report and Written Opinion dated Apr. 17, 2023 in PCT Application No. PCT/US2022/081376.
International Search Report and Written Opinion dated Apr. 19, 2023, in Application No. PCT/US2022/081845.
International Search Report and Written Opinion dated Apr. 24, 2020 issued in Application No. PCT/US2019/067540.
International Search Report and Written Opinion dated Aug. 17, 2023, in Application No. PCT/US2023/019871.
International Search Report and Written Opinion dated Aug. 22, 2019 issued in Application No. PCT/US2019/031618.
International Search Report and Written Opinion dated Jan. 27, 2021 issued in Application No. PCT/US2020/054730.
International Search Report and Written Opinion dated Jul. 4, 2024 in PCT Application No. PCT/US2024/019555.
International Search Report and Written Opinion dated Mar. 23, 2021 issued in Application No. PCT/US2020/053856.
International Search Report and Written Opinion dated Mar. 24, 2022, for International Application No. PCT/US2021/061751.
International Search Report and Written Opinion dated Nov. 4, 2021 in PCT Application No. PCT/US2021/042106.
International Search Report and Written Opinion dated Nov. 11, 2022 in PCT Application No. PCT/US2022/037733.
International Search Report and Written Opinion dated Oct. 8, 2020 in Application No. PCT/US2020/038968.
International Search Report and Written Opinion dated Oct. 13, 2021, in application No. PCT/US2021/037924.
International Search Report and Written Opinion dated Oct. 16, 2020 issued in Application No. PCT/US2020/039615.
International Search Report and Written Opinion dated Oct. 16, 2020 issued in Application No. PCT/US2020/070171.
International Search Report and Written Opinion dated Oct. 16, 2020 issued in Application No. PCT/US2020/070172.
International Search Report and Written Opinion dated Oct. 17, 2022 in PCT Application No. PCT/US2022/033488.
International Search Report and Written Opinion dated Oct. 28, 2021 in PCT Application No. PCT/US2021/040381.
International Search Report and Written Opinion dated Oct. 8, 2020 issued in Application No. PCT/US2020/038968.
International Search Report and Written Opinion dated Sep. 15, 2021, in PCT Application No. PCT/US2021/034019.
JP Office Action dated Jul. 26, 2022 in Application No. JP2021102822 With English translation.
JP Office Action dated Nov. 15, 2022, in Application No. JP2021-176082 with English translation.
JP Notice of Allowances dated Aug. 27, 2024 in JP Application No. 2022-559416 with English translation.

(56) References Cited

OTHER PUBLICATIONS

JP Notice of Allowances dated Sep. 3, 2024 in JP Application No. 2023-63868 with English translation.
JP Office Action dated Apr. 2, 2024 in JP Application No. 2022-559416, with English Translation.
JP Office Action dated Apr. 27, 2023 in Application No. JP2021-575910 with English translation.
JP Office Action dated Feb. 13, 2024 in JP Application No. 2023-63868, with English Translation.
JP Office Action dated Jan. 9, 2024 in JP Application No. 2023-179933, with English Translation.
JP Office Action dated Jan. 9, 2024 in JP Application No. 2023-184334 with English Translation.
JP Office Action dated Jan. 17, 2023, in Application No. JP2022-552422 with English translation.
JP Office Action dated Jun. 27, 2023, in Application No. JP2022-552422 with English translation.
JP Office Action dated Jun. 27, 2023, in application No. JP2023-63868 with English translation.
JP Office Action dated Mar. 5, 2024 in JP Application No. 2021-575910, with English Translation.
JP Office Action dated Nov. 14, 2023, in JP Application No. 2021-0575910 with English Translation.
JP Office Action dated Nov. 14, 2023 in JP Application No. 2022-559416, with English Translation.
JP Office Action dated Oct. 10, 2023 in Application No. JP2022-552422 with English Translation.
KR Notice of Allowance dated Aug. 1, 2024 in KR Application No. 10-2024-7012307, with English Translation.
KR Office Action dated Feb. 8, 2022, in Application No. KR10-2021-7030794 with English Translation.
KR Office Action dated Apr. 9, 2024 in KR Application No. 10-2023-7038357 with English Translation.
KR Office Action dated Apr. 23, 2024 in KR Application No. 10-2016-0152489 with English translation.
KR Office Action dated Aug. 11, 2023, in Application No. KR10-2023-7011840 with English translation.
KR Office Action dated Feb. 29, 2024 in KR Application No. 10-2022-7026649, with English Translation.
KR Office Action dated Jul. 12, 2024 in KR Application No. 10-2022-7029421 with English translation.
KR Office Action dated Jul. 12, 2024 in KR Application No. 10-2023-7036296 with English translation.
KR Office Action dated Jun. 24, 2024 in KR Application No. 10-2022-7002869, with English Translation.
KR Office Action dated Mar. 14, 2024 in KR Application No. 10-2021-7022858, with English Translation.
KR Office Action dated May 9, 2022, in Application No. KR1020217030794 with English translation.
KR Office Action dated Nov. 21, 2023 in KR Application No. 10-2022-7002869 with English Translation.
KR Office Action dated Nov. 21, 2023 in KR Application No. 10-2022-7029421 with English Translation.
Kwon, J., et al., "Substrate Selectivity of (tBu-Allyl)Co(C0)3 during Thermal Atomic Layer Deposition of Cobalt," Chemistry of Materials, Mar. 27, 2012; 24(6): pp. 1025-1030.
Lemaire, P.C., et al., "Understanding inherent substrate selectivity during atomic layer deposition: Effect of surface preparation, hydroxyl density, and metal oxide composition on nucleation mechanisms during tungsten ALD" The Journal of chemical physics, Feb. 7, 2017, 146(5):052811.
Lu, Y., et al., "Continuous formation of supported cubic and hexagonal mesoporous films by sol-gel dip-coating" Nature, Sep. 1997, 389(6649), pp. 364-368.
Mackus, A.J., et al. "The use of atomic layer deposition in advanced nanopatterning", Nanoscale. Jul. 25, 2014; 6(19):10941-60.
Nazarov, D.V., et al., "Atomic layer deposition of tin dioxide nanofilms: A review", Rev. Adv. Mater. Sci. Jun. 1, 2015; 40(3):262-75.
Notice of Allowance dated Dec. 9, 2021 in U.S. Appl. No. 17/310,635.
Rantala, et al., "New resist and underlayer approaches toward EUV lithography," Proc. SPIE 10809, International Conference on Extreme Ultraviolet Lithography 2018, pp. 108090X-1-108090X-8. (Oct. 11, 2018).
SG Written Opinion dated Aug. 30, 2024 in SG Application No. 11202114183P.
TW Office Action dated Jan. 9, 2023 In Application No. TW20190116155 with English translation.
TW Office Action dated Sep. 5, 2022, in Application No. TW110101388 with English translation.
TW Office Action dated Apr. 19, 2024 in TW Application No. 112146727 with English translation.
TW Office Action dated Apr. 22, 2024 in TW Application No. 112126160 with English translation.
TW Office Action dated Apr. 29, 2022 in Application No. TW110118172 with English translation.
TW Office Action dated Aug. 17, 2023, in application No. TW110124741 with Translation.
TW Office Action dated Jan. 11, 2024 in TW Application No. 108146890, with English Translation.
TW Office Action dated Jan. 13, 2023, in Application No. TW110124741 with English translation.
TW Office Action dated Jan. 19, 2023 in Application No. TW110141961 with English translation.
TW Office Action dated Jul. 2, 2024 in TW Application No. 109134940 with English translation.
TW Office Action dated Jul. 9, 2024 in TW Application No. 110111086 with English translation.
TW Office Action dated Jun. 27, 2024 in TW Application No. 113107490 with English translation.
TW Office Action dated Mar. 21, 2024 in TW Application No. 108146890, with English Translation.
TW Office Action dated Mar. 7, 2022, in Application No. TW110101388 with English translation.
TW Office Action dated May 16, 2023, in Application No. TW20190146890 with English translation.
TW Office Action dated Oct. 13, 2023, in application No. TW109121680 with English Translation.
U.S. Advisory Action dated Apr. 16, 2024 in U.S. Appl. No. 17/596,648.
U.S. Advisory Action dated Jun. 24, 2024 in U.S. Appl. No. 18/377,245.
U.S. Advisory Action dated May 7, 2024 in U.S. Appl. No. 18/298,003.
U.S. Advisory Action dated Sep. 3, 2024 in U.S. Appl. No. 18/377,267.
U.S. Advisory Action dated Sep. 5, 2024 in U.S. Appl. No. 17/759,281.
U.S. Corrected Notice of Allowance dated Aug. 29, 2024 in U.S. Appl. No. 17/596,648.
U.S. Final Office Action dated Feb. 27, 2024 in U.S. Appl. No. 18/298,003.
U.S. Final Office Action dated Jun. 21, 2024 in U.S. Appl. No. 18/377,267.
U.S. Final Office Action dated Jun. 27, 2024 in U.S. Appl. No. 17/759,281.
U.S. Final Office Action dated Mar. 5, 2024 in U.S. Appl. No. 17/596,648.
U.S. Final Office Action dated Mar. 12, 2024 in U.S. Appl. No. 18/377,245.
U.S. Final Office Action dated May 3, 2024 in U.S. Appl. No. 18/297,989.
U.S. Final Office Action dated May 9, 2024 in U.S. Appl. No. 17/309,587.
U.S. Final Office Action dated May 12, 2023 in U.S. Appl. No. 17/455,185.
U.S. Final Office Action dated Nov. 9, 2023 in U.S. Appl. No. 17/455,185.
U.S. Non-Final Office Action dated Feb. 1, 2024 in U.S. Appl. No. 17/759,281.
U.S. Non-Final office Action dated Feb. 7, 2023 in U.S. Appl. No. 17/455,185.
U.S. Non-Final Office Action dated Jun. 21, 2024 in U.S. Appl. No. 17/596,648.

(56) References Cited

OTHER PUBLICATIONS

U.S. Non-Final Office Action dated Mar. 4, 2024 in U.S. Appl. No. 17/758,125.
U.S. Non-Final Office Action dated Mar. 4, 2024 in U.S. Appl. No. 18/377,267.
U.S. Non-Final Office Action dated May 29, 2024 in U.S. Appl. No. 18/298,003.
U.S. Non-Final Office Action dated Nov. 6, 2023, in U.S. Appl. No. 17/309,587.
U.S. Non-Final Office Action dated Nov. 20, 2023 in U.S. Appl. No. 18/377,245.
U.S. Non-Final Office Action dated Oct. 1, 2024 in U.S. Appl. No. 17/309,587.
U.S. Non-Final Office Action dated Oct. 9, 2024 in U.S. Appl. No. 18/377,245.
U.S. Non-Final Office Action dated Oct. 13, 2023, in U.S. Appl. No. 18/184,545.
U.S. Non-Final Office Action dated Oct. 20, 2023, in U.S. Appl. No. 18/297,989.
U.S. Non-Final Office Action dated Oct. 20, 2023, in U.S. Appl. No. 18/298,003.
U.S. Non-Final Office Action dated Oct. 26, 2023, in U.S. Appl. No. 17/596,648.
U.S. Notice of Allowance dated Aug. 7, 2024 in U.S. Appl. No. 18/184,545 .
U.S. Notice of Allowance dated Aug. 16, 2024 in U.S. Appl. No. 17/596,648.
U.S. Notice of Allowance dated Feb. 22, 2022 in U.S. Appl. No. 17/310,635.
U.S. Notice of Allowance dated Mar. 6, 2024 in U.S. Appl. No. 18/184,545.
U.S. Notice of Allowance dated Mar. 13, 2024 in U.S. Appl. No. 18/184,545.
U.S. Notice of Allowance dated Sep. 9, 2024 in U.S. Appl. No. 18/184,545.
US Notice of Allowance dated Sep. 15, 2021, issued in U.S. Appl. No. 16/691,508.
US Notice of Allowance dated Sep. 9, 2021, issued in U.S. Appl. No. 16/691,508.
U.S. Appl. No. 18/569,213, inventors Kanakasabapathy S K, et al., filed Dec. 11, 2023.
U.S. Appl. No. 18/850,628, inventors Li D, et al., filed Sep. 25, 2024.
U.S. Appl. No. 18/850,990, inventors Lee Y, et al., filed Sep. 25, 2024.
U.S. Restriction Requirement dated Nov. 14, 2022 in U.S. Appl. No. 17/455,185.
U.S. Restriction requirement dated Aug. 4, 2023, in U.S. Appl. No. 18/297,989.
U.S Restriction requirement dated Aug. 18, 2023 in U.S. Appl. No. 18/298,003.
U.S. Restriction Requirement dated Nov. 20, 2023 in U.S. Appl. No. 17/759,281.
U.S. Restriction requirement dated Sep. 7, 2023 in U.S. Appl. No. 17/309,587.
Xu, et al., "Underlayer designs to enhance the performance of EUV resists," Proceedings of SPIE, vol. 7273, 2009, pp. 727311-1-727311-11.
CN Office Action dated Dec. 2, 2024 in CN Application No. 202211142175.7, with English Translation.
International Preliminary Report on Patentability and Written Opinion dated Nov. 14, 2024 in PCT Application No. PCT/US2023/019871.
International Search Report and Written Opinion dated Nov. 20, 2024 in PCT Application No. PCT/US2024/039915.
JP Office Action dated Nov. 12, 2024 in JP Application No. 2024-522188 with English translation.
KR Notice of Allowance dated Dec. 12, 2024 in KR Application No. 10-2016-0152489, with English Translation.
KR Notice of Allowances dated Oct. 16, 2024 in KR Application No. 10-2022-7002869 with English Translation.
KR Office Action dated Nov. 28, 2024 in KR Application No. 10-2022-7014896, with English Translation.
TW Office Action dated Nov. 26, 2024 in TW Application No. 110126445, with English Translation.
U.S. Corrected Notice of Allowance dated Dec. 30, 2024 in U.S. Appl. No. 17/309,587.
U.S. Corrected Notice of Allowance dated Dec. 31, 2024 in U.S. Appl. No. 18/377,267.
U.S. Corrected Notice of Allowance dated Nov. 21, 2024 in U.S. Appl. No. 17/309,587.
U.S. Non-Final Office Action dated Jan. 3, 2025 in U.S. Appl. No. 18/769,038.
U.S. Notice of Allowance dated Dec. 13, 2024 in U.S. Appl. No. 18/377,267.
U.S. Notice of Allowance dated Nov. 14, 2024 in U.S. Appl. No. 17/309,587.
U.S. Appl. No. 18/855,026, inventors Lee Y, et al., filed Oct. 8, 2024.
U.S. Appl. No. 18/932,475, inventors Marks J, et al., filed Oct. 30, 2024.
U.S. Appl. No. 18/980,854, inventors Volosskiy B et al., filed Dec. 13, 2024.
U.S. Restriction requirement dated Oct. 30, 2024 in U.S. Appl. No. 18/769,038.
U.S. Restriction requirement dated Oct. 30, 2024 in U.S. Appl. No. 18/769,048.
U.S. Supplemental Notice of Allowance dated Nov. 15, 2024 in U.S. Appl. No. 18/184,545.
International Search Report and Written Opinion dated Oct. 13, 2023 in PCT Application No. PCT/US2023/069419.
EP Office Action dated Jan. 21, 2025 in EP Application No. 23173688.5.
International Search Report and Written Opinion dated Dec. 26, 2024 in PCT Application No. PCT/US2024/046887.
International Search Report and Written Opinion dated Feb. 21, 2025 in PCT Application No. PCT/US2024/054953.
International Search Report and Written Opinion dated Sep. 13, 2024 in PCT Application No. PCT/US2024/033522.
JP Office Action dated Jan. 7, 2025 in JP Application No. 2023-533602, with English Translation.
KR Notice of Allowance dated Jan. 23, 2025 in KR Application No. 10-2024-7037880, with English Translation.
KR Office Action dated Feb. 5, 2025 in KR Application No. 10-2022-7037995, with English Translation.
KR Office Action dated Jan. 15, 2025 in KR Application No. 10-2023-7023253, with English Translation.
KR Office Action dated Mar. 13, 2025 in KR Application No. 10-2023-7004801, with English Translation.
TW Office Action and Search Report dated Jan. 16, 2025 in TW Application No. 113105443, with English Translation.
TW Office Action dated Apr. 17, 2025 in TW Application No. 113105443, with English Translation.
TW Office Action dated Apr. 17, 2025 in TW Application No. 113118322, with English Translation.
TW Office Action dated Jan. 20, 2025 in TW Application No. 108146890, with English Translation.
TW Office Action dated Mar. 11, 2025 in TW Application No. 110126445, with English Translation.
U.S. Corrected Notice of Allowance dated Mar. 20, 2025 in U.S. Appl. No. 18/377,245.
U.S. Non-Final Office Action dated Apr. 17, 2025 in U.S. Appl. No. 18/769,038.
U.S. Non-Final Office Action dated Jan. 24, 2025 in U.S. Appl. No. 18/769,048.
U.S. Non-Final Office Action dated Mar. 5, 2025 in U.S. Appl. No. 18/850,628.
U.S. Notice of Allowance dated Apr. 9, 2025 in U.S. Appl. No. 18/850,990.
U.S. Notice of Allowance dated Mar. 7, 2025 in U.S. Appl. No. 18/377,245.
U.S. Appl. No. 19/076,745, inventors Yu J et al., filed Mar. 11, 2025.

(56) References Cited

OTHER PUBLICATIONS

U.S. Appl. No. 19/179,005, inventors Dictus D et al., filed Apr. 15, 2025.
U.S. Appl. No. 19/181,906, inventors Li D et al., filed Apr. 17, 2025.
U.S. Restriction Requirement dated Mar. 20, 2025 in U.S. Appl. No. 17/753,110.
U.S. Supplemental Notice of Allowance dated Mar. 17, 2025 in U.S. Appl. No. 18/377,267.
U.S. Appl. No. 19/182,430, inventors Weidman T.W et al., filed Apr. 17, 2025.
JP Office Action dated May 13, 2025 in JP Application No. 2023-502906, with English Translation.
US Non-Final Office Action dated May 5, 2025 in U.S. Appl. No. 18/769,048.
U.S. Appl. No. 19/202,425, inventors Hansen E.C et al., filed May 8, 2025.
CN Office Action dated May 29, 2025 in CN Application No. 202211142175.7 with English translation.
JP Office Action dated Jun. 10, 2025 in JP Application No. 2024-559372, with English Translation.
KR Office Action dated Jul. 22, 2025 in KR Application No. 10-2024-7037744, with English Translation.
SG Written Opinion dated Jun. 30, 2025 in SG Application No. 11202114183P.
SG Written Opinion dated Jun. 30, 2025 in SG Application No. 11202251459E.
TW Office Action and Search Report dated Jul. 8, 2025 in TW Application No. 110145602, with English Translation.
TW Office Action dated Jul. 24, 2025 in TW Application No. 113118322, with English Translation.
U.S. Final Office Action dated Jul. 1, 2025 in U.S. Appl. No. 18/850,628.
US Non-Final Office Action dated Jul. 14, 2025 in U.S. Appl. No. 18/005,571.
US Non-Final Office Action dated Jul. 15, 2025 in U.S. Appl. No. 18/254,787.
US Non-Final Office Action dated Jun. 18, 2025 in U.S. Appl. No. 17/753,110.
U.S. Notice of Allowance dated Jul. 8, 2025 in U.S. Appl. No. 18/850,990.
Barret M C., et al., "Copper, Zinc and Tin Hydroxypyridinones," Transition Metal Chemistry, Jan. 2015, vol. 40, pp. 241-254.
Cilibrizzi A., et al., "Hydroxypyridinone Journey into Metal Chelation," Chemical Review, Jul. 2018, vol. 118, pp. 7657-7701.
CN Office Action dated Aug. 12, 2025 in CN Application No. 202211142175.7, with English Translation.
Fitzgerald A., et al., "Determination of Trace Metals in Positive Photoresist," Journal of the Electrochemical Society, May 1992, vol. 139 (5), pp. 1413-1414.
JP Office Action dated Aug. 5, 2025 in JP Application No. 2021-575910, with English Translation.
Stowers et al.; "Directly patterned inorganic hard mask for EUV lithography"; proceedings of the SPIE 7969; Extreme Ultraviolet (EUV) Lithography 11, 796915-1-11 (Apr. 7, 2011), event: SPI E Advanced Lithography, 2011, San Jose California.
U.S. Final Office Action dated Aug. 20, 2025 in U.S. Appl. No. 18/769,038.
U.S. Final Office Action dated Aug. 22, 2025 in U.S. Appl. No. 18/769,048.
EP Extended European Search report dated Sep. 24, 2025 in EP Application No. 25172399.5.
EP Office Action dated Oct. 24, 2025 in EP Application No. 24775376.7.
International Preliminary Report on Patentability and Written Opinion dated Oct. 2, 2025 in PCT Application No. PCT/US2024/019555.
JP Office Action dated Sep. 9, 2025 in JP Application No. 2023-502906, with English Translation.
KR Office Action dated Aug. 27, 2025 in KR Application No. 10-2022-7014896, with English Translation.
TW Office Action and Search Report dated Nov. 6, 2025 in TW Application No. 113109390, with English Translation.
TW Office Action and Search Report dated Oct. 31, 2025 in TW Application No. 113128085, with English Translation.
U.S. Non-Final Office Action dated Oct. 1, 2025 in U.S. Appl. No. 17/905,632.
U.S. Notice of Allowance dated Oct. 17, 2025 in U.S. Appl. No. 18/769,038.
U.S. Notice of Allowance dated Oct. 17, 2025 in U.S. Appl. No. 18/769,048.
U.S. Appl. No. 19/352,826, inventors Lee Y et al., filed on Oct. 8, 2025.

\* cited by examiner

CYCLIC DEVELOPMENT OF METAL OXIDE BASED PHOTORESIST FOR ETCH STOP DETERRENCE

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety.

BACKGROUND

The fabrication of semiconductor devices, such as integrated circuits, is a multi-step process involving photolithography. In general, the process includes the deposition of material on a wafer and patterning the material through lithographic techniques to form structural features (e.g., transistors and circuitry) of the semiconductor device. The steps of a typical photolithography process known in the art include: preparing the substrate; applying a photoresist, such as by spin coating; exposing the photoresist to light in a desired pattern, causing the exposed areas of the photoresist to become more or less soluble in a developer solution; developing by applying a developer solution to remove either the exposed or the unexposed areas of the photoresist; and subsequent processing to create features on the areas of the substrate from which the photoresist has been removed, such as by etching or material deposition.

One challenge in manufacturing devices having such small features is the ability to reliably, and reproducibly, create photolithographic masks of sufficient resolution. Current photolithography processes typically use 193 nm ultraviolet (UV) light to expose a photoresist. The fact that the light has a wavelength significantly greater than the desired size of the features to be produced on the semiconductor substrate creates inherent issues. Achieving feature sizes smaller than the wavelength of the light requires use of complex resolution enhancement techniques, such as multipatterning. Thus, there is significant interest and research effort in developing photolithographic techniques using shorter wavelength light, such as extreme ultraviolet radiation (EUV), having a wavelength of from 10 nm to 15 nm, e.g., 13.5 nm.

EUV photolithographic processes can present challenges, however, including low power output and loss of light during patterning. Traditional organic chemically amplified resists (CAR) similar to those used in 193 nm UV lithography have potential drawbacks when used in EUV lithography, particularly as they have low absorption coefficients in EUV region and the diffusion of photo-activated chemical species can result in blur or line edge roughness. Furthermore, in order to provide the etch resistance required to pattern underlying device layers, small features patterned in conventional CAR materials can result in high aspect ratios at risk of pattern collapse. Accordingly, there remains a need for improved EUV photoresist materials, having such properties as decreased thickness, greater absorbance, and greater etch resistance.

The background description provided herein is for the purpose of generally presenting the context of the present technology. Work of the presently named inventors, to the extent it is described in this background section, as well as aspects of the description that may not otherwise qualify as prior art at the time of filing, are neither expressly nor impliedly admitted as prior art against the present technology.

SUMMARY

Provided are processes for development of metal or metal oxide-based thin film photoresists post-EUV exposure for removal of non-volatile species and deterring etch stop. Repeated cycles of alternating treatment with an etchant and an oxidizing agent; or treatment with an etchant followed by treatment with a wash agent are effective techniques for removal of the undesired unexposed portion of a photoresist.

Accordingly, in a first aspect, the present invention encompasses a method for processing a semiconductor substrate. In some embodiments, the method of includes providing a photopatterned metal-containing resist on a semiconductor substrate on a pedestal in a process chamber; and developing the photopatterned metal-containing resist by selectively removing a portion of the photopatterned metal-containing resist by exposing the photopatterned metal-containing resist to at least one cycle including a pulse of an etchant and a pulse of an oxidizing agent, delivered alternately, to form a resist mask.

In some embodiments, the pulse of the etchant and the pulse of the oxidizing agent are temporally separate.

In some embodiments, the pedestal is at a first temperature during the pulse of the etchant; and the oxidizing agent is delivered to the process chamber at a second temperature.

In some embodiments, the pedestal is at a first temperature during the pulse of the etchant and the pedestal is at a second temperature during the pulse of the oxidizing agent.

In some embodiments, a duration of the pulse of the etchant is from about 1 to about 120 seconds and a duration of the pulse of the oxidizing agent is from about 1 to about 120 seconds.

In some embodiments, the first temperature is from about −60° C. to about 120° C.

In some embodiments, the second temperature is from about 20° C. to about 150° C.

In some embodiments, the second temperature is from about 50° C. to about 250° C.

In some embodiments, non-volatile byproducts of the pulse of the etchant are removed from the photopatterned metal-containing resist.

In some embodiments, the photopatterned metal-containing resist is an organo-metal oxide, a metal oxide, a metal or an organo-metal.

In some embodiments, the metal oxide is a tin oxide.

In some embodiments, the etchant is a halide etchant.

In some embodiments, the halide etchant is a hydrogen halide, hydrogen gas and halogen gas, an organic halide, an acyl halide, a carbonyl halide, a thionyl halide or a combination thereof.

In some embodiments, the halide etchant is hydrogen fluoride, hydrogen chloride, boron trichloride, hydrogen bromide, hydrogen iodide or a combination thereof.

In some embodiments, the etchant is an etchant plasma.

In some embodiments, the etchant plasma is generated remotely.

In some embodiments, the oxidizing agent is oxygen, ozone, hydrogen peroxide, water, nitrous oxide, nitric oxide, nitrogen dioxide, nitric acid, sulfur dioxide, chlorine, fluorine, bromine, iodine or a combination thereof.

In some embodiments, the oxidizing agent is a gaseous oxidizing agent of water and oxygen or chlorine.

In some embodiments, the oxidizing agent is an oxidizing agent plasma.

In some embodiments, the oxidizing agent plasma is generated remotely.

In some embodiments, the method also includes exposing the photopatterned metal-containing resist to an inert plasma gas.

In some embodiments, the method also includes purging the process chamber with an inert gas between the pulse of the etchant and the pulse of the oxidizing agent or after a cycle of a pulse of the etchant and a pulse of the oxidizing agent.

In some embodiments, developing the photopatterned metal-containing resist by exposure to alternating pulses of an etchant and an oxidizing agent is dry developing the photopatterned metal-containing resist.

In some embodiments, developing the photopatterned metal-containing resist by exposure to alternating pulses of an etchant and an oxidizing agent is wet developing the photopatterned metal-containing resist.

In some embodiments, each cycle has the same etchant pulse duration.

In a second aspect, the present invention encompasses a method of processing a semiconductor substrate. In some embodiments, the method includes providing a photopatterned metal-containing resist on a semiconductor substrate on a pedestal in a process chamber; and developing the photopatterned metal-containing resist by selectively removing a portion of the photopatterned metal-containing resist by exposing the photopatterned metal-containing resist to an etchant, followed by subsequent exposure to a wash agent, to form a resist mask.

In some embodiments, the wash agent is water, methanol, ethanol, isopropanol, acetone, acetonitrile, tetrahydrofuran, dimethyl sulfide or a combination thereof.

In some embodiments, a pedestal temperature is from about 10° C. to about 50° C. during exposure to the wash agent.

In some embodiments, the wash agent is a supercritical fluid.

In some embodiments, the supercritical fluid is a low surface tension supercritical liquid.

In some embodiments, the low surface tension supercritical liquid is carbon dioxide, sulfur dioxide, dimethyl ether or a combination thereof.

In some embodiments, a process chamber pressure is from about 5 psi to about 3,000 psi during exposure to the wash agent.

In some embodiments, non-volatile byproducts from etchant exposure are removed from the photopatterned metal-containing resist.

In some embodiments, the photopatterned metal-containing resist is an organo-metal oxide, a metal, a metal oxide or an organo-metal.

In some embodiments, the metal oxide is a tin oxide.

In some embodiments, the etchant is a halide etchant.

In some embodiments, the halide etchant is a hydrogen halide, hydrogen gas and halogen gas, an organic halide, an acyl halide, a carbonyl halide, a thionyl halide or a combination thereof.

In some embodiments, the halide etchant is hydrogen fluoride, hydrogen chloride, boron trichloride, hydrogen bromide, hydrogen iodide or a combination thereof.

In some embodiments, the etchant is an etchant plasma.

In some embodiments, the etchant plasma is generated remotely.

In a third aspect, the present invention encompasses a method of promoting atomic layer etching on a substrate. In some embodiments, the method includes providing a photopatterned metal-containing resist on a semiconductor substrate on a pedestal in a process chamber; and developing the photopatterned metal-containing resist by selectively removing a portion of the resist by exposing the photopatterned metal-containing resist to at least one cycle including a pulse of an etchant and a pulse of an oxidizing agent, delivered alternately, to form a resist mask; whereby etch stop due to non-volatile byproducts of the etchant pulse is eliminated.

In a fourth aspect, the present invention encompasses a method of processing a semiconductor substrate. In some embodiments, the method includes providing a dry-deposited photopatterned metal oxide EUV resist on a semiconductor substrate on a pedestal in a process chamber; and dry developing the photopatterned metal oxide EUV resist by selectively removing an EUV-unexposed portion of the EUV resist by exposure to at least one cycle including a pulse of an etchant and a pulse of an oxidizing agent, delivered alternately, to form a resist hard mask.

In a fifth aspect, the present invention encompasses an apparatus for conducting development of resist. In some embodiments, the apparatus includes a process chamber with a substrate support; a vacuum line coupled to the process chamber; etchant and oxidizing agents lines coupled to the process chamber; and a controller configured with instructions for processing a semiconductor substrate, the instructions including code for: providing a photopatterned metal-containing resist on a semiconductor substrate in a process chamber; and developing the photopatterned metal-containing resist by selectively removing a portion of the resist by exposure to at least one cycle of an etchant pulse and an oxidizing agent pulse, delivered alternately, to form a resist mask.

In some embodiments, the photopatterned metal-containing resist is a photopatterned metal-containing EUV resist, and wherein the controller configured with instructions including code for developing the photopatterned metal-containing EUV resist has code for selectively removing an EUV-unexposed portion of the EUV resist relative to an EUV-exposed portion with at least one cycle of an etchant pulse and an oxidizing agent pulse, delivered alternately, to form the resist mask.

In some embodiments, the apparatus also includes one or more heaters coupled to the substrate support, wherein the one or more heaters include a plurality of independently controllable temperature control zones.

In some embodiments, the apparatus also includes heated oxidizing agent delivery lines.

These and other features of the disclosed embodiments will be described in detail below with reference to the associated drawings.

DETAILED DESCRIPTION

Figure 1:
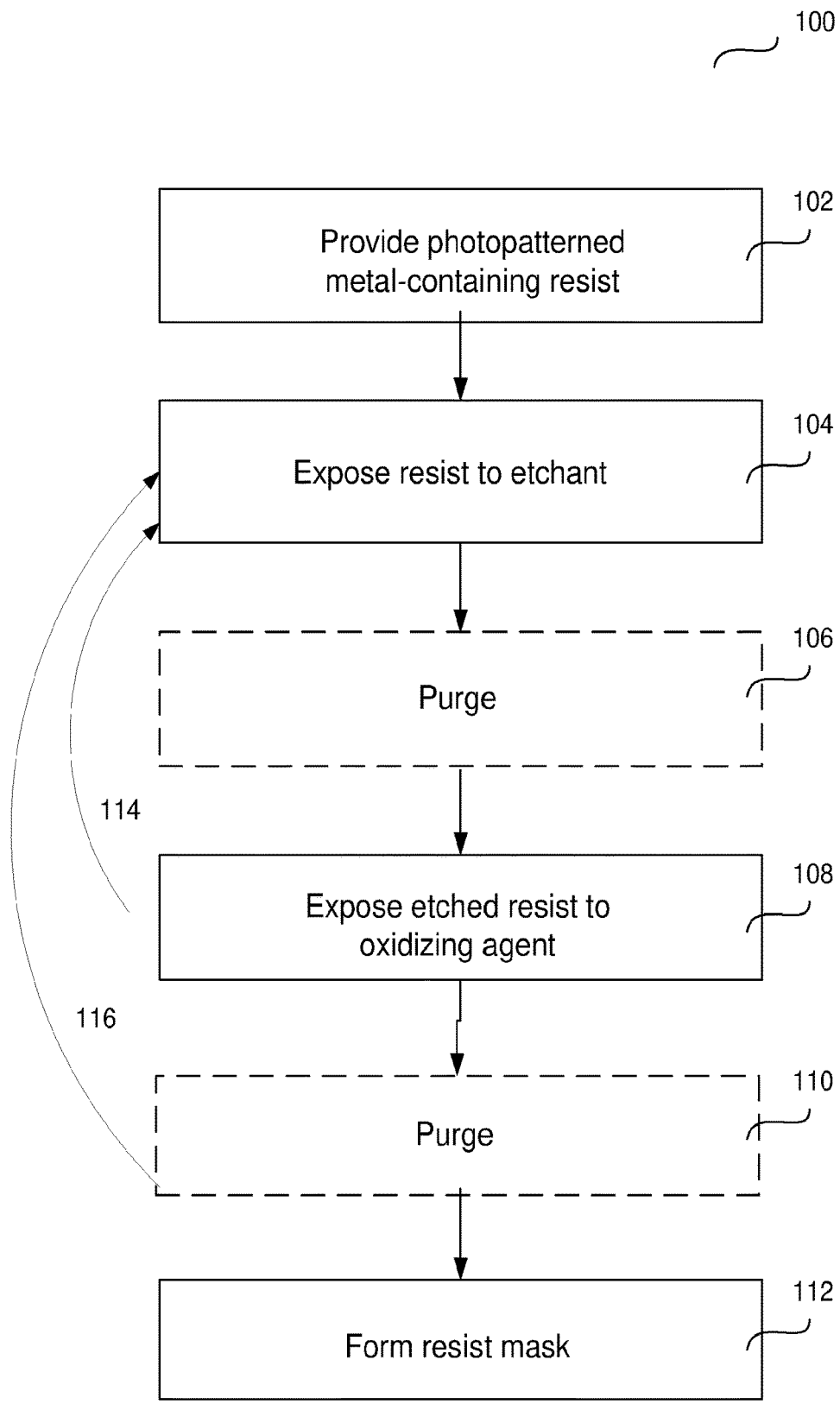
FIG. 1 presents a flow diagram of an example cyclic method for depositing and developing a photoresist in accordance with certain disclosed embodiments.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

The implementations disclosed below describe deposition of a material on a substrate such as a wafer, substrate, or other work piece. The work piece may be of various shapes, sizes, and materials. In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. Unless otherwise stated, the processing details recited herein (e.g., flow rates, power levels, etc.) are relevant for processing 300 mm diameter substrates, or for treating chambers that are configured to process 300 mm diameter substrates and can be scaled as appropriate for substrates or chambers of other sizes. In addition to semiconductor wafers, other work pieces that may be used implementations disclosed herein include various articles such as printed circuit boards and the like. The processes and apparatuses can be used in the fabrication of semiconductor devices, displays, LEDs, photovoltaic panels and the like.

By halide is meant an anion of F, Cl, Br or I.

As used herein, the term "about" means+/−10% of any recited value, unless otherwise specified. As used herein, this term modifies any recited value, range of values, or endpoints of one or more ranges.

As used herein, the terms "top," "bottom," "upper," "lower," "above," and "below" are used to provide a relative relationship between structures. The use of these terms does not indicate or require that a particular structure must be located at a particular location in the apparatus.

As used herein, the phrase at least one of A, B, and C should be construed to mean a logical (A OR B OR C), using a non-exclusive logical OR, and should not be construed to mean 'at least one of A, at least one of B, and at least one of C.

By "atomic layer deposition" (ALD) is meant a vapor deposition process in which deposition cycles, preferably a plurality of consecutive deposition cycles, are conducted in a process chamber (i.e., a deposition chamber). Typically, during each cycle, the precursor is chemisorbed to a deposition surface (i.e., a substrate assembly surface or a previously deposited underlying surface such as material from a previous ALD cycle) forming a monolayer or sub-monolayer that does not readily react with additional precursor (i.e., a self-limiting reaction). Thereafter, if necessary, a reactant (i.e., another precursor or reaction gas) may be introduced into the process chamber for use in converting the chemisorbed precursor to the desired material on the deposition surface. Typically, this reactant is capable of reaction with the already chemisorbed precursor. Further, purging steps may also utilized during each cycle to remove excess precursor from the process chamber and/or remove excess reactant and/or reaction by-products from the process chamber after conversion of the chemisorbed precursor.

By "deposition" or "vapor deposition" is meant a process in which a metal layer is formed on one or more surfaces of a substrate from vaporized precursor composition(s) including one or more metal containing compounds. The metal-containing compounds are vaporized and directed to and/or contacted with one or more surfaces of a substrate (i.e., semiconductor substrate or semiconductor assembly) placed in a deposition chamber. Typically, the substrate is heated. These metal containing compounds form a non-volatile, thin, uniform metal-containing layer on the surface(s) of the substrate. One operation of the method is one cycle, and the process can be repeated for as many cycles necessary to obtain the desired metal thickness.

By "etchant" is meant any compound used to remove a material such as a layer, byproduct or contaminant from a surface.

By "wafer" is meant a material which may include a substrate and a substrate layer to be etched. In some embodiments, the substrate layer includes an ashable hard mask such as spin-on carbon (SoC) or other material, e.g., silicon, silicon oxide, silicon nitride, silicon carbide, etc. In some embodiments, the substrate layer may be a layer stack disposed on the substrate.

By "photopatterned metal-containing resist film" is meant a thin film which may have an organo-metal-containing layer disposed on a substrate layer to be etched. The photopatterned metal-containing EUV resist film may have a thickness between about 5 nm and about 50 nm or between about 10 nm and about 30 nm. The photopatterned metal-containing EUV resist film may be provided in a process chamber after photopatterning in an EUV scanner and/or after a PEB treatment as described above. The photopatterned metal-containing EUV resist film includes non-EUV exposed regions and EUV exposed regions. Non-EUV exposed regions of the photopatterned metal-containing EUV resist film can be removed in a dry development process by exposure to flows of dry development chemistry without striking a plasma. The dry development chemistry may include a halide-containing chemistry such as a hydrogen halide or hydrogen and halogen gas. A resist mask is formed after development by removal of the non-EUV exposed regions. Thereafter, the substrate layer to be etched may be etched using the resist mask to provide the desired structure.

By "byproduct" is meant any compound which may be an impurity, a decomposition product or contaminant of the gas being delivered to the deposition chamber.

By "delivery lines" is meant any process equipment such as piping, tubes, or conduits that may be utilized to transport or convey a gas (e.g., reactant(s) and/or precursor(s)). In the semiconductor manufacturing process, precursor delivery lines may be used to transport precursors to a deposition chamber and may be formed from stainless steel or nickel alloys.

This disclosure relates generally to the field of semiconductor processing. In some aspects, the disclosure is directed to processes and apparatuses for development of photoresists (e.g., EUV-sensitive metal and/or metal oxide-containing photoresists) using etchants 1) in combination with an oxidizing agent in a cyclic dry development process, or 2) in combination with a wash agent, to form a patterning mask in the context of EUV patterning. Such processes may advantageously widen the process window of dry development and/or may extend the applicability of dry development to different metal or metal-oxide based photoresist systems.

Reference is made herein in detail to specific embodiments of the disclosure. Examples of the specific embodiments are illustrated in the accompanying drawings. While the disclosure will be described in conjunction with these specific embodiments, it will be understood that it is not intended to limit the disclosure to such specific embodiments. On the contrary, it is intended to cover alternatives, modifications, and equivalents as may be included within the spirit and scope of the disclosure. In the following description, numerous specific details are set forth in order to provide a thorough understanding of the present disclosure. The present disclosure may be practiced without some or all of these specific details. In other instances, well known process operations have not been described in detail so as to not unnecessarily obscure the present disclosure.

Patterning of thin films in semiconductor processing is often an important step in the fabrication of semiconductors. Patterning involves lithography. In conventional photolithography, such as 193 nm photolithography, patterns are printed by emitting photons from a photon source onto a mask and printing the pattern onto a photosensitive photoresist, thereby causing a chemical reaction in the photoresist that, after development, removes certain portions of the photoresist to form the pattern.

Advanced technology nodes (as defined by the International Technology Roadmap for Semiconductors) include nodes 22 nm, 16 nm, and beyond. In the 16 nm node, for example, the width of a typical via or line in a Damascene structure is typically no greater than about 30 nm. Scaling of features on advanced semiconductor integrated circuits (ICs) and other devices is driving lithography to improve resolution.

Extreme ultraviolet (EUV) lithography can extend lithography technology by moving to smaller imaging source wavelengths than would be achievable with conventional photolithography methods. EUV light sources at approximately 10-20 nm, or 11-14 nm wavelength, for example 13.5 nm wavelength, can be used for leading-edge lithography tools, also referred to as scanners. The EUV radiation is strongly absorbed in a wide range of solid and fluid materials including quartz and water vapor, and so operates in a vacuum.

EUV lithography makes use of EUV resists that are patterned to form masks for use in etching underlying layers. EUV resists may be polymer-based chemically amplified resists (CARs) produced by liquid-based spin-on techniques. An alternative to CARs is directly photopatternable metal oxide-containing films, such as those available from Inpria, Corvallis, OR, and described, for example, in US Patent Publications US 2017/0102612, US 2016/021660 and US 2016/0116839, incorporated by reference herein at least for their disclosure of photopatternable metal oxide-containing films. Such films may be produced by spin-on techniques or dry vapor-deposited. The metal oxide-containing film can be patterned directly (i.e., without the use of a separate photoresist) by EUV exposure in a vacuum ambient providing sub-30 nm patterning resolution, for example as described in U.S. Pat. No. 9,996,004, issued Jun. 12, 2018 and titled EUV PHOTOPATTERNING OF VAPOR-DEPOSITED METAL OXIDE-CONTAINING HARDMASKS, and/or in Application PCT/US19/31618, filed May 9, 2019, and titled METHODS FOR MAKING EUV PATTERNABLE HARD MASKS, the disclosures of which at least relating to the composition, deposition, and patterning of directly photopatternable metal oxide films to form EUV resist masks is incorporated by reference herein. Generally, the patterning involves exposure of the EUV resist with EUV radiation to form a photo pattern in the resist, followed by development to remove a portion of the resist according to the photo pattern to form the mask.

It should also be understood that the while present disclosure relates to lithographic patterning techniques and materials exemplified by EUV lithography, it is also applicable to other next generation lithographic techniques. In addition to EUV, which includes the standard 13.5 nm EUV wavelength currently in use and development, the radiation sources most relevant to such lithography are DUV (deep-UV), which generally refers to use of 248 nm or 193 nm excimer laser sources, X-ray, which formally includes EUV at the lower energy range of the X-ray range, as well as e-beam, which can cover a wide energy range. The specific methods may depend on the particular materials and applications used in the semiconductor substrate and ultimate semiconducting device. Thus, the methods described in this application are merely exemplary of the methods and materials that may be used in present technology.

Directly photopatternable EUV resists may be composed of or contain metals and/or metal oxides mixed within organic components. The metals/metal oxides are highly promising in that they can enhance the EUV photon adsorption and generate secondary electrons and/or show increased etch selectivity to an underlying film stack and device layers. To date, these resists have been developed using a wet (solvent) approach, which requires the wafer to move to the track, where it is exposed to developing solvent, dried and baked. Wet development does not only limit productivity but can also lead to line collapse due to surface tension effects and/or delamination.

Dry development techniques have been proposed to overcome these issues by eliminating substrate delamination and interface failures. Dry development can improve performance (e.g., prevent line collapse due to surface tension and delamination in wet development) and enhance throughput (e.g., by avoiding wet development track). Other advantages may include eliminating the use of organic solvent developers, reduced sensitivity to adhesion issues, increased EUV absorption for improved dose efficiency, and a lack of solubility-based limitations. Dry development can also provide more tunability and give further critical dimension (CD) control and scum removal.

Dry development has its own challenges, including etch selectivity between unexposed and EUV exposed resist material which can lead to a higher dose to size requirement for effective resist exposure when compared to wet development. Suboptimal selectivity can also cause PR corner rounding due to longer exposures under etching gas, which may increase line CD variation in the following transfer etch step.

Development of EUV Resist

According to various aspects of the present disclosure, a photopatterned metal-containing photoresist is developed by exposure to halide-containing chemistries. An EUV-sensitive metal or metal oxide-containing film, e.g., an organotin oxide, is disposed on a semiconductor substrate. The EUV-sensitive metal or metal oxide-containing film is patterned directly by EUV exposure in vacuum ambient. A pattern is then developed to form a resist mask using a development chemistry. In some embodiments, the development chemistry is a dry development chemistry. In some embodiments, the dry development chemistry includes hydrogen and a halide. Such dry development techniques may be done while using either a gentle plasma (high pressure, low power) or a thermal process while flowing a hydrogen and halide dry development chemistry. This disclosure provides processes and apparatus configured for development of a metal-containing resist as part of a resist mask formation process.

Metal and/or metal oxide photoresists are attractive material candidates for advanced photolithography. Their capability to operate with higher resolution, high etch selectivity and lower dose enables photo adsorption enhancement and secondary electrons generation. After EUV exposure, a wet development is conventionally applied to remove undesired materials. However, this process may lead to increased defects due to interface failure and/or line collapse caused by surface tension.

A dry development helps overcome these issues by eliminating substrate delamination and interface failures. Yet the complete removal of undesired unexposed portion of photoresist relies on the generation of a volatile and stable byproduct of dry development. The volatility and stability of byproducts from dry development may be impacted by the organic ligands utilized in the metal and/or metal oxide photoresist system. In some cases, the byproduct is either non-volatile, or volatile but non-stable. If the byproduct is volatile but non-stable, it can further decompose into a non-volatile species. Non-volatile byproducts result in an etch stop and incomplete development, increasing the risk of high surface roughness and defect formation.

An optional post-application bake (PAB) is performed after deposition of the EUV-patternable film and prior to EUV exposure. The PAB treatment may involve a combination of thermal treatment, chemical exposure, and moisture to increase the EUV sensitivity of the EUV-patternable film, reducing the EUV dose to develop a pattern in the EUV-patternable film. The PAB treatment temperature may be tuned and optimized for increasing the sensitivity of the EUV-patternable film. For example, the treatment temperature may be between about 90° C. and about 200° C. or between about 150° C. and about 190° C. In some embodiments, the PAB treatment may be conducted with a pressure between atmospheric and vacuum, and a treatment duration of about 1 to 15 minutes, for example about 2 minutes. In some embodiments, the PAB treatment is conducted at a temperature between about 100° C. to 200° C. for about 1 minute to 2 minutes.

The metal-containing EUV resist film is exposed to EUV radiation to develop a pattern. Generally speaking, the EUV exposure causes a change in the chemical composition and cross-linking in the metal-containing EUV resist film, creating a contrast in etch selectivity that can be exploited for subsequent development.

The metal-containing EUV resist film may then be patterned by exposing a region of the film to EUV light, typically under relatively high vacuum. EUV devices and imaging methods among those useful herein include methods known in the art. In particular, as discussed above, exposed areas of the film are created through EUV patterning that have altered physical or chemical properties relative to unexposed areas. For example, in exposed areas, metal-carbon bond cleavage may occur, as through a beta-hydride elimination, leaving behind reactive and accessible metal hydride functionality that can be converted to hydroxide and cross-linked metal oxide moieties via metal-oxygen bridges during a subsequent post-exposure bake (PEB) step. This process can be used to create chemical contrast for development as a negative tone resist. In general, a greater number of beta-H in the alkyl group results in a more sensitive film. This can also be explained as weaker Sn—C bonding with more branching. Following exposure, the metal-containing EUV resist film may be baked, so as to cause additional cross-linking of the metal oxide film. The difference in properties between exposed and unexposed areas may be exploited in subsequent processing, such as to dissolve unexposed areas or to deposit materials on the exposed areas. For example, the pattern can be developed using a dry method to form a metal oxide-containing mask.

In particular, in various embodiments, the hydrocarbyl-terminated tin oxide present on the surface is converted to hydrogen-terminated tin oxide in the exposed region(s) of an imaging layer, particularly when the exposure is performed in a vacuum using EUV. However, removing exposed imaging layers from vacuum into air, or the controlled introduction of oxygen, ozone, $H_2O_2$, or water, can result in the oxidation of surface Sn—H into Sn—OH. The difference in properties between exposed and unexposed regions may be exploited in subsequent processing, such as by reacting the irradiated region, the unirradiated region, or both, with one or more reagents to selectively add material to or remove material from the imaging layer.

Without limiting the mechanism, function or utility of present technology, EUV exposure, for example, at doses of from 10 mJ/cm$^2$ to 100 mJ/cm$^2$ results in the cleavage of Sn—C bonds resulting is loss of the alkyl substituent, alleviating steric hindrance and allowing the low-density film to collapse. In addition, reactive metal-H bond generated in the beta-hydride elimination reactions can react with neighboring active groups such as hydroxyls in the film, leading to further cross-linking and densification, and creating chemical contrast between exposed and unexposed region(s).

Following exposure of the metal-containing EUV resist film to EUV light, a photopatterned metal-containing EUV resist is provided. The photopatterned metal-containing EUV resist includes EUV-exposed and unexposed regions.

An optional post-exposure bake (PEB) is performed to further increase contrast in etch selectivity of the photopatterned metal-containing EUV resist. The photopatterned metal-containing EUV resist can be thermally treated in the presence of various chemical species to facilitate cross-linking of the EUV-exposed regions or simply baked on a hot plate in ambient air, for example between 150° C. and 250° C. for between one and five minutes (e.g., 190° C. for two minutes).

In various embodiments, a bake strategy involves careful control of the bake ambient, introduction of reactive gases, and/or careful control of the ramping rate of the bake temperature. Examples of useful reactive gases include e.g., air, $H_2O$, $H_2O_2$ vapor, $CO_2$, CO, $O_2$, $O_3$, $CH_4$, $CH_3OH$, $N_2$, $H_2$, $NH_3$, $N_2O$, NO, alcohol, acetyl acetone, formic acid, Ar, He, or their mixtures. The PEB treatment is designed to (1) drive complete evaporation of organic fragments that are generated during EUV exposure and (2) oxidize any Sn—H, Sn—Sn, or Sn radical species generated by EUV exposure into metal hydroxide, and (3) facilitate cross-linking between neighboring Sn—OH groups to form a more densely crosslinked $SnO_2$-like network. The bake temperature is carefully selected to achieve optimal EUV lithographic performance. Too low a PEB temperature would lead to insufficient cross-linking, and consequently less chemical contrast for development at a given dose. Too high a PEB temperature would also have detrimental impacts, including severe oxidation and film shrinkage in the unexposed region (the region that is removed by development of the patterned film to form the mask in this example), as well as, undesired interdiffusion at the interface between the photopatterned metal-containing EUV resist and an underlayer, both of which can contribute to loss of chemical contrast and an increase in defect density due to insoluble scum. The PEB treatment temperature may be between about 100° C. and about 300° C., between about 170° C. and about 290° C., or between about 200° C. and about 240° C. In some embodiments, the PEB treatment may be conducted with a pressure between atmospheric and vacuum, and a treatment duration of about 1 to 15 minutes, for example about 2 minutes. In some embodiments, PEB thermal treatment may be repeated to further increase etch selectivity.

The photopatterned metal-containing EUV resist is developed to form a resist mask. In various embodiments, the exposed regions are removed (positive tone) or the unexposed regions are removed (negative tone). In some embodiments, development may include selective deposition on either the exposed or unexposed regions of the photopatterned metal-containing EUV resist, followed by an etching operation. In various embodiments, these processes may be dry processes or wet processes. The development may be done without striking a plasma in some embodiments. Or development may be done with flows of hydrogen and halide (e.g., $H_2$ and $Cl_2$ and/or $Br_2$) activated in a remote plasma source or activated by exposure to remote UV radiation. The photoresist for development may include an element selected from the group consisting of tin, hafnium, tellurium, bismuth, indium, antimony, iodine, and germanium. The element may have a high patterning radiation-absorption cross-section. In some embodiments, the element may have a high EUV-absorption cross-section. In some embodiments, the metal-containing EUV resist may have an overall absorption greater than 30%. In an all-dry lithography process, this provides more efficient utilization of EUV photons, enabling development of thicker and more EUV-opaque resists.

Examples of processes for development involve an organotin oxide-containing EUV-sensitive photoresist thin film (e.g., 10-30 nm thick, such as 20 nm), subjected to a EUV exposure dose and post-exposure bake, and then developed. The photoresist film may be, for example, deposited based on a gas phase reaction of an organotin precursor such as isopropyl(tris)(dimethylamino)tin and water vapor, or may be a spin-on film comprising tin clusters in an organic matrix.

The photopatterned metal-containing EUV resist is developed by exposure to a development chemistry, where the development chemistry is a halide-containing chemistry. In some embodiments, the development chemistry includes hydrogen and halide, such as a hydrogen halide (e.g., HBr or HCl) or hydrogen and halogen gases (e.g., $H_2$ and $Cl_2$). In some embodiments, the development chemistry includes a hydrogen halide, hydrogen and halogen gases, boron trichloride, or combinations thereof. Development of the EUV resist can be done by wet development using halide-containing chemistries or dry development using hydrogen halide-containing chemistries. In embodiments where the EUV resist is developed using wet development, the wet development may be combined with other wet processing operations such as wet deposition (e.g., spin-on deposition) of the metal-containing EUV resist film. Alternatively, the wet development may be combined with other dry processing operations such as vapor deposition (e.g., CVD) of the metal-containing EUV resist film. In embodiments where the EUV resist is developed using dry development, the dry development may be combined with other dry processing operations such as dry deposition (e.g., CVD) of the metal-containing EUV resist film. In alternative embodiments where the EUV resist is developed using dry development, the dry development may be combined with other wet processing operations such as wet deposition (e.g., spin-on deposition) of the metal-containing EUV resist film.

In some embodiments, processing of the semiconductor substrate may combine all dry steps including film formation by vapor deposition, EUV lithographic patterning, and dry development. In fact, each of the operations 102-112 in the process 100 may be dry processing operations. Such processing operations may avoid material and productivity costs associated with wet processing operations such as wet development. Dry processing can provide more tunability and add further critical dimension (CD) control and scum removal. Wet processing generally involves moisture and/or oxygen, which more easily leads to scum formation. Wet development is limited by solubility and cluster size, whereas dry development is not limited by solubility and cluster size. Wet development is more prone to pattern collapse and delamination issues that dry development avoids. In addition, employing all-dry processing operations may facilitate integration within interconnected vacuum processing chamber without exposure to and contamination by ambient air or trace contaminates contained therein. For example, the PEB thermal treatment during which exposed regions undergo further crosslinking may be conducted in the same chamber as development, though it will be understood that the PEB thermal treatment may be performed in another chamber.

Development processes can be done by delivering development chemistry in a liquid or vapor phase. In some embodiments, dry development processes can be done by using either a gentle plasma (high pressure, low power) or a thermal process while flowing a hydrogen halide-containing dry development chemistry such as HF, HCl, HBr, or HI. For example, dry development can be carried out in a thermal process using dry development chemistry such as HCl or HBr. In some embodiments, the hydrogen halide-containing chemistry is able to quickly remove the unexposed material, leaving behind a pattern of the exposed film that can be transferred into the underlying layers by plasma-based etch processes, for example conventional etch processes.

In thermal development processes, the substrate is exposed to development chemistry (e.g., a Lewis Acid) in a process chamber (e.g., oven). In some embodiments, a vacuum line is coupled to the process chamber for pressure control, and a development chemistry line may be coupled to the process chamber for delivery of development chemistry into the process chamber. The process chamber may include one or more heaters for temperature control, such as heaters coupled to a substrate support in the process chamber for substrate temperature control. In some embodiments, the chamber interior can be coated with corrosion resistant films, such as organic polymers or inorganic coatings. One such coating is polytetrafluoroethylene (PTFE), e.g., Teflon 1M. Such materials can be used in thermal processes of this disclosure without risk of removal by plasma exposure.

In thermal development processes, the photopatterned metal-containing EUV resist is exposed to development chemistry at a temperature that is optimized for etch selectivity between exposed and unexposed regions. Lower temperatures may increase contrast in etch selectivity while higher temperatures may decrease contrast in etch selectivity. In some embodiments, a temperature may be between about −60° C. and about 120° C., between about-20° C. and about 60° C., or between about −20° C. and about 20° C., such as about-10° C. Chamber pressure may be tuned, where chamber pressure may influence etch selectivity between exposed and unexposed regions during development. In some embodiments, the chamber pressure may be relatively low and accompanied without dilution, where the chamber pressure may be between about 0.1 mTorr and about 300 mTorr, between about 0.2 mTorr and about 100 mTorr, or between about 0.5 mTorr and about 50 mTorr. In some embodiments, the chamber pressure may be between about 20 mTorr and about 800 mTorr, or between about 20 mTorr and about 500 mTorr, such as about 300 mTorr. In some embodiments, the chamber pressure may be relatively high with high flow and accompanied by dilution, where the chamber pressure may be between about 100 Torr and about 760 Torr or between about 200 Torr and about 760 Torr. Reactant flow rate may be tuned, where reactant flow may influence etch selectivity between exposed and unexposed regions during development. In some embodiments, reactant flow may be between about 50 sccm and about 2000 sccm, between about 100 sccm and about 2000 sccm, or between about 100 sccm and about 1000 sccm, such as about 500 sccm. In instances with high flow, reactant flow may be between about 1 L and about 10 L. Duration of exposure may be tuned in the thermal development process. The duration of exposure may depend on how much resist is desired to be removed, development chemistry, amount of crosslinking in the resist, and composition and properties of the resist, among other factors. In some embodiments, duration of exposure may be between about 5 seconds and about 5 minutes, between about 10 seconds and about 3 minutes, or between about 10 seconds and about 1 minute.

Thermal development processes may expose the photopatterned metal-containing EUV resist to certain halide-containing chemistries in the vapor or liquid phase. In some embodiments, the development chemistry includes a hydrogen halide, hydrogen and halogen gas, boron trichloride, an organic halide, an acyl halide, a carbonyl halide, a thionyl halide, or mixtures thereof. A hydrogen halide can include but is not limited to HF, HCl, HBr, and HI. For example, the hydrogen halide can be HCl or HBr. Hydrogen and halogen gas can include but is not limited to hydrogen gas ($H_2$) mixed with $F_2$, $Cl_2$, $Br_2$, or $I_2$. Boron trichloride ($BCl_3$) may be used in combination with any of the aforementioned hydrogen halides or hydrogen and halogen gases. An organic halide can include but is not limited to $C_xH_yF_z$, $C_xH_yCl_z$, $C_xH_yBr_z$, and $C_xH_yI_z$, where x, y, and z are values equal to or greater than 0. An acyl halide can include but is not limited to $CH_3COF$, $CH_3COCl$, $CH_3COBr$, and $CH_3COI$. A carbonyl halide can include but is not limited to $COF_2$, $COCl_2$, $COBr_2$, and $COI_2$. A thionyl halide can include but is not limited to $SOF_2$, $SOCl_2$, $SoBr_2$, and $SOI_2$. In some embodiments, the halide-containing chemistry may be flowed with or without inert/carrier gas such as He, Ne, Ar, Xe, and $N_2$.

In the formation of semiconductor devices, various layers may be selectively etched. Atomic layer etching may be used to provide an etch with high selectivity. In an atomic layer etch (ALE), a cyclical process is provided. The cyclical process may have a first step of modifying part of an etch layer and a second step of removing the modified part of the etch layer. Such an ALE may use a self-limiting process to modify part of the etch layer. The self-limiting process may modify a few monolayers of the etch layer forming a self-limiting layer. In such a case, the removing of the modified part of the etch layer may remove just a few atomic layers of the etch layer. As a result, many cycles are needed in order to etch a substantial part of the etch layer. Each cycle may be more than 12 seconds long. As a result, an ALE process may take a long time in order to etch a substantial part of an etch layer.

ALE processes used to etch carbon containing etch layers, such as amorphous carbon, use low bias voltages. In such processes, the low bias voltages may be applied for several seconds in order to provide an ALE while preventing or reducing sputtering caused by higher biases. Some of the drawbacks to such processes using a low bias are that such ALE processes are slower and the ions under a low bias for the ALE process are not highly directional. Since the ions are not highly directional, the resulting features do not have a high height to width aspect ratio.

Atomic layer etching processes are described in U.S. Pat. No. 10,566,212, entitled "Designer Atomic Layer Etching," by Kanarik, issued Feb. 18, 2020; U.S. Pat. No. 10,763,083, entitled "High Energy Atomic Layer Etching," by Yang et al., issued Sep. 1, 2020; US 2021/0005425A1, entitled "Atomic Layer Etching and Smoothing of Refractory Metals and Other High Surface Binding Energy Materials," by Yang et al., published Jan. 2, 2021; WO 2020/223152A1, entitled "Atomic Layer Etching for Subtractive Metal Etch," by Yang et al., published on Nov. 5, 2020; and U.S. Provisional Patent Application Ser. No. 63/322,535, entitled "Fast Atomic Layer Etch", filed on Mar. 22, 2022, which are all incorporated by references for all purposes.

The thermal development process may be done without plasma. By applying a non-plasma thermal approach, productivity can be significantly improved as multiple wafers can be batch developed, at the same time in a low-cost thermal vacuum chamber/oven. However, in some embodiments, the thermal development process may be followed by exposure to plasma. Subsequent exposure to plasma may occur for desorption, descumming, smoothing, or other processing operations.

In plasma development processes, the photopatterned metal-containing EUV resist is exposed to development chemistry including radicals/ions of one or more gases. A process chamber for processing the semiconductor substrate may be a plasma-generating chamber or coupled to a plasma-generating chamber remote from the process chamber. Dry development may occur by remote plasma in some embodiments. The plasma-generating chamber may be an inductively-coupled plasma (ICP) reactor, transformer-coupled plasma (TCP) reactor, or capacitively-coupled plasma (CCP) reactor, employing equipment and techniques among those known in the art. An electromagnetic field acts on the one or more gases to produce a plasma in the plasma-generating chamber. Ions and/or radicals from the remote plasma may interact with the photopatterned metal-containing EUV resist. In some embodiments, a vacuum line is coupled to the process chamber for pressure control, and a development chemistry line may be coupled to the plasma-generating chamber for delivery of the one or more gases into the plasma-generating chamber. The process chamber may include one or more heaters for temperature control, such as heaters coupled to a substrate support in the process chamber for substrate temperature control. In some embodiments, the process chamber interior can be coated with corrosion resistant films, such as organic polymers or inorganic coatings. One such coating is polytetrafluoroethylene (PTFE), e.g., Teflon 1M. Such materials can be used in thermal processes of this disclosure without risk of removal by plasma exposure.

In plasma development processes, the photopatterned metal-containing EUV resist is exposed to remote plasma under conditions that are optimized for etch selectivity between exposed and unexposed regions. The conditions may be optimized for generating a gentle plasma, where a gentle plasma can be characterized by high pressure and low power. Chamber pressure may be tuned, where chamber pressure may influence etch selectivity between exposed and unexposed regions during development. In some embodiments, the chamber pressure may be equal to or greater than about 5 mTorr, or equal to or greater than about 15 mTorr. In some embodiments, the chamber pressure may be relatively high with high flow and accompanied by dilution, where the chamber pressure may be between about 100 Torr and about 760 Torr or between about 200 Torr and about 760 Torr. RF power levels may be tuned, where RF power may affect etch selectivity, roughness, descumming, and other characteristics of development. In some embodiments, the RF power may be equal to or less than about 1000 W, equal to or less than about 800 W, or equal to or less than about 500 W. Temperature may be tuned, where temperature may influence various aspects of development such as etch selectivity. In some embodiments, a temperature may be between about −60° C. and about 300° C., between about 0° C. and about 300° C., or between about 30° C. and about 120° C. Gas flow rate may be tuned, where gas flow may influence etch selectivity between exposed and unexposed regions during development. In some embodiments, gas flow rate is between about 50 sccm and about 2000 sccm, between about 100 sccm and about 2000 sccm, or between about 200 sccm and about 1000 sccm, such as about 500 sccm. Duration of exposure may be tuned in the plasma development process. The duration of exposure may depend on how much resist is desired to be removed, development chemistry, amount of crosslinking in the resist, and composition and properties of the resist, among other factors. In some embodiments, duration of exposure may be between about 1 second and about 50 minutes, between about 3 seconds and about 20 minutes, or between about 10 seconds and about 6 minutes.

Plasma development processes may expose the photopatterned metal-containing EUV resist to radicals of certain halide-containing gases. In some embodiments, the radicals are generated from a remote plasma source. For example, the plasma development may expose the photopatterned metal-containing EUV resist to radicals of hydrogen and halide gases generated from the remote plasma source. In some embodiments, a halide-containing gas includes a hydrogen halide, hydrogen and halogen gas, boron trichloride, an organic halide, an acyl halide, a carbonyl halide, a thionyl halide, or mixtures thereof. A hydrogen halide can include but is not limited to hydrogen fluoride (HF), hydrogen chloride (HCl), hydrogen bromide (HBr), and hydrogen iodide (HI). For example, the hydrogen halide may be HCl or HBr. Hydrogen and halogen gas can include but is not limited to hydrogen gas ($H_2$) mixed with fluorine gas ($F_2$), chlorine gas ($Cl_2$), bromine gas ($Br_2$), or iodine gas ($I_2$). An organic halide can include but is not limited to $C_xH_yF_z$, $C_xH_yCl_z$, $C_xH_yBr_z$, and $C_xH_yI_z$, where x, y, and z are values equal to or greater than 0. An acyl halide can include but is not limited to $CH_3COF$, $CH_3COCl$, $CH_3COBr$, and $CH_3COI$. A carbonyl halide can include but is not limited to $COF_2$, $COCl_2$, $COBr_2$, and $COI_2$. A thionyl halide can include but is not limited to $SOF_2$, $SOCl_2$, $SoBr_2$, and $SOI_2$. In some embodiments, the halide-containing gas may be flowed with or without inert/carrier gas such as He, Ne, Ar, Xe, and $N_2$.

In addition, or in the alternative to plasma activation, activation of the one or more gases in a dry development process may occur by photoactivation. In some embodiments, the photoactivation may be achieved by exposure to ultraviolet (UV) radiation. For example, the process chamber may include a lamp such as a UV lamp configured to generate UV radiation. Exposing the one or more gases to UV radiation may generate radicals of the one or more gases that can be used in dry development of the photopatterned metal-containing EUV resist. Exposure of the one or more gases to UV radiation may occur in a manner without exposing the photopatterned resist to UV radiation. In other words, the photopatterned resist is out-of-sight with respect to the UV lamp. Hence, the UV lamp may be remote from the process chamber or positioned in a manner that avoids exposing the photopatterned resist to UV radiation.

It will be understood that the aforementioned methods of thermal development, plasma development, and photoactivation development may be combined together. Such development methods may be applied simultaneously or sequentially. The development methods may be applied while flowing dry development chemistry in the liquid or vapor phase, where the dry development chemistry can include a compound of the formula $R_xZ_y$, where R=B, Al, Si, C, S, SO with x>0 and Z=Cl, H, Br, F, $CH_4$ and y>0. The development can result in a positive or a negative tone, in which the $R_xZ_y$ species selectively removes either the unexposed or the exposed material, leaving behind the exposed or unexposed counterpart as a mask.

As described above, etch selectivity during dry development is tunable by controlling process conditions such as temperature, pressure, gas flow, gas composition, and plasma power, among other tunable process conditions. Tuning etch selectivity in a single step or multiple steps may achieve desired patterned characteristics. In some embodiments, etch selectivity during dry development is tuned across one or more steps to influence EUV resist profile. More specifically, the amount of taper or a re-entrant angle in the EUV resist profile can be controlled by applying development chemistry of different etch selectivity over one or more steps. Descumming, photoresist reworking, curing, smoothing, and cleaning operations may also be tuned according to a tunable etch selectivity.

FIG. 1 presents a flow diagram of an example method for depositing and developing a photoresist according to some embodiments. The operations of a process 100 may be performed in different orders and/or with different, fewer, or additional operations. One or more operations of the process 100 may be performed using an apparatus described in any one of FIGS. 7-10. In some embodiments, the operations of the process 100 may be implemented, at least in part, according to software stored in one or more non-transitory computer readable media.

In operation 102 of the process 100, a photopatterned metal containing resist is provided. The resist may be deposited either by a dry deposition process such as a vapor deposition process or by a wet process such as a spin-on deposition process.

The photoresist may be a metal-containing EUV resist. An EUV-sensitive metal or metal oxide-containing film may be deposited on a semiconductor substrate by any suitable technique, including wet (e.g., spin-on) or dry (e.g., CVD) deposition techniques. For example, described processes have been demonstrated for EUV photoresist compositions based on organotin oxides, being applicable to both commercially spin-coatable formulations and formulations applied using dry vacuum deposition techniques, further described below.

Semiconductor substrates may include any material construct suitable for photolithographic processing, particularly for the production of integrated circuits and other semiconducting devices. In some embodiments, semiconductor substrates are silicon wafers. Semiconductor substrates may be silicon wafers upon which features have been created ("underlying features"), having an irregular surface topography. As referred to herein, the "surface" is a surface onto which a film of the present disclosure is to be deposited or that is to be exposed to EUV during processing. Underlying features may include regions in which material has been removed (e.g., by etching) or regions in which materials have been added (e.g., by deposition) during processing prior to conducting a method of this disclosure. Such prior processing may include methods of this disclosure or other processing methods in an iterative process by which two or more layers of features are formed on the substrate.

EUV-sensitive thin films may be deposited on the semiconductor substrate, such films being operable as resists for subsequent EUV lithography and processing. Such EUV-sensitive thin films comprise materials which, upon exposure to EUV, undergo changes, such as the loss of bulky pendant substituents bonded to metal atoms in low density M-OH rich materials, allowing their crosslinking to denser M-O-M bonded metal oxide materials. Through EUV patterning, areas of the film are created that have altered physical or chemical properties relative to unexposed areas. These properties may be exploited in subsequent processing, such as to dissolve either unexposed or exposed areas, or to selectively deposit materials on either the exposed or unexposed areas. In some embodiments, the unexposed film has a more hydrophobic surface than the exposed film under the conditions at which such subsequent processing is performed. For example, the removal of material may be performed by leveraging differences in chemical composition, density and cross-linking of the film. Removal may be by wet processing or dry processing, as further described below.

The thin films are, in various embodiments, organometallic materials, for example organotin materials comprising tin oxide, or other metal oxide materials/moieties. The organometallic compounds may be made in a vapor phase reaction of an organometallic precursor with a counter reactant. In various embodiments, the organometallic compounds are formed through mixing specific combinations of organometallic precursors having bulky alkyl groups or fluoroalkyl groups with counter-reactants and polymerizing the mixture in the vapor phase to produce a low-density, EUV-sensitive material that deposits onto the semiconductor substrate.

In various embodiments, organometallic precursors comprise at least one alkyl group on each metal atom that can survive the vapor-phase reaction, while other ligands or ions coordinated to the metal atom can be replaced by the counter-reactants. Organometallic precursors include those of the formula:

$$M_a R_b L_c \qquad \text{(Formula 1)}$$

wherein: M is an element with a high patterning radiation-absorption cross-section; R is alkyl, such as $C_n H_{2n+1}$, preferably wherein $n \geq 2$; L is a ligand, ion or other moiety which is reactive with the counter-reactant; $a \geq 1$; $b \geq 1$; and $c \geq 1$.

In various embodiments, M has an atomic absorption cross section equal to or greater than $1 \times 10^7$ cm$^2$/mol. M may be, for example, selected from the group consisting of tin, hafnium, tellurium, bismuth, indium, antimony, germanium, and combinations thereof. In some embodiments, M is tin. R may be fluorinated, e.g., having the formula $C_n F_x H_{(2n+1)}$. In various embodiments, R has at least one beta-hydrogen or beta-fluorine. For example, R may be selected from the group consisting of ethyl, i-propyl, n-propyl, t-butyl, i-butyl, n-butyl, sec-butyl, n-pentyl, i-pentyl, t-pentyl, sec-pentyl, and mixtures thereof. L may be any moiety readily displaced by a counter-reactant to generate an M-OH moiety, such as a moiety selected from the group consisting of amines (such as dialkylamino, monoalkylamino), alkoxy, carboxylates, halogens, and mixtures thereof.

Organometallic precursors may be any of a wide variety of candidate metal-organic precursors. For example, where M is tin, such precursors include t-butyl tris(dimethylamino) tin, i-butyl tris(dimethylamino) tin, n-butyl tris(dimethylamino) tin, sec-butyl tris(dimethylamino) tin, i-propyl(tris) dimethylamino tin, n-propyl tris(dimethylamino) tin, ethyl tris(dimethylamino) tin and analogous alkyl(tris) (t-butoxy) tin compounds such as t-butyl tris(t-butoxy) tin. In some embodiments, the organometallic precursors are partially fluorinated.

Counter-reactants have the ability to replace the reactive moieties, ligands or ions (e.g., L in Formula 1, above) so as to link at least two metal atoms via chemical bonding. Counter-reactants can include water, peroxides (e.g., hydrogen peroxide), di- or polyhydroxy alcohols, fluorinated di- or polyhydroxy alcohols, fluorinated glycols, and other sources of hydroxyl moieties. In various embodiments, a counter-reactant reacts with the organometallic precursor by forming oxygen bridges between neighboring metal atoms. Other potential counter-reactants include hydrogen sulfide and hydrogen disulfide, which can crosslink metal atoms via sulfur bridges.

The thin films may include optional materials in addition to an organometallic precursor and counter-reactants to modify the chemical or physical properties of the film, such as to modify the sensitivity of the film to EUV or enhancing etch resistance. Such optional materials may be introduced, such as by doping during vapor phase formation prior to deposition on the semiconductor substrate, after deposition of the thin film, or both. In some embodiments, a gentle remote $H_2$ plasma may be introduced so as to replace some Sn-L bonds with Sn—H, which can increase reactivity of the resist under EUV.

In various embodiments, the EUV-patternable films are made and deposited on the semiconductor substrate using vapor deposition equipment and processes among those known in the art. In such processes, the polymerized organometallic material is formed in vapor phase or in situ on the surface of the semiconductor substrate. Suitable processes include, for example, chemical vapor deposition (CVD), atomic layer deposition (ALD), and ALD with a CVD component, such as a discontinuous, ALD-like process in which metal precursors and counter-reactants are separated in either time or space.

In general, methods comprise mixing a vapor stream of an organometallic precursor with a vapor stream of a counter-reactant so as to form a polymerized organometallic material, and depositing the organometallic material onto the surface of the semiconductor substrate. In some embodiments, more than one organometallic precursor is included in the vapor stream. In some embodiments, more than one counter-reactant is included in the vapor stream. As will be understood by one of ordinary skill in the art, the mixing and depositing aspects of the process may be concurrent, in a substantially continuous process.

In an example continuous CVD process, two or more gas streams, in separate inlet paths, of organometallic precursor and source of counter-reactant are introduced to the deposition chamber of a CVD apparatus, where they mix and react in the gas phase, to form agglomerated polymeric materials (e.g., via metal-oxygen-metal bond formation). The streams may be introduced, for example, using separate injection inlets or a dual-plenum showerhead. The apparatus is configured so that the streams of organometallic precursor and counter-reactant are mixed in the chamber, allowing the organometallic precursor and counter-reactant to react to form a polymerized organometallic material. Without limiting the mechanism, function, or utility of present technology, it is believed that the product from such vapor-phase reaction becomes heavier in molecular weight as metal atoms are crosslinked by counter-reactants, and is then condensed or otherwise deposited onto the semiconductor substrate. In various embodiments, the steric hindrance of the bulky alkyl groups prevents the formation of densely packed network and produces smooth, amorphous, low-density films.

The CVD process is generally conducted at reduced pressures, such as from 10 milliTorr to 10 Torr. In some embodiments, the process is conducted at from 0.5 to 2 Torr. In some embodiments, the temperature of the semiconductor substrate is at or below the temperature of the reactant streams. For example, the substrate temperature may be from 0° C. to 250° C., or from ambient temperature (e.g., 23° C.) to 150° C. In various processes, deposition of the polymerized organometallic material on the substrate occurs at rates inversely proportional to surface temperature.

In some embodiments, the EUV-patternable films are made and deposited on the semiconductor substrate using wet deposition equipment and processes among those known in the art. For example, the organometallic material is formed by spin-coating on the surface of the semiconductor substrate.

The thickness of the EUV-patternable film formed on the surface of the semiconductor substrate may vary according to the surface characteristics, materials used, and processing conditions. In various embodiments, the film thickness may range from 0.5 nm to 100 nm, and may be a sufficient thickness to absorb most of the EUV light under the conditions of EUV patterning. The EUV-patternable film may be able to accommodate absorption equal to or greater than 30%, thereby having significantly fewer EUV photons available towards the bottom of the EUV-patternable film. Higher EUV absorption leads to more cross-linking and densification near the top of an EUV-exposed film compared to the bottom of the EUV-exposed film. Though insufficient cross-linking may cause the resist to be more prone to liftoff or collapse in wet development, such as risk is not as present in dry development. An all-dry lithography approach may facilitate more efficient utilization of EUV photons by more opaque resist films. Though efficient utilization of EUV photons may occur with EUV-patternable films having higher overall absorption, it will be understood that in some instances, the EUV-patternable film may be less than about 30%. For comparison, the maximum overall absorption of most other resist films is less than 30% (e.g., 10% or less, or 5% or less) so that the resist material at the bottom of the resist film is sufficiently exposed. In some embodiments, the film thickness is from 10 nm to 40 nm or from 10 nm to 20 nm. Without limiting the mechanism, function, or utility of present disclosure, it is believed that, unlike wet, spin-coating processes of the art, the processes of the present disclosure have fewer restrictions on the surface adhesion properties of the substrate, and therefore can be applied to a wide variety of substrates. Moreover, as discussed above, the deposited films may closely conform to surface features, providing advantages in forming masks over substrates, such as substrates having underlying features, without "filling in" or otherwise planarizing such features.

Returning to FIG. 1, in operation 104, the photopatterned metal-containing resist is exposed to a pulse of etchant. A pulse as used herein refers to a specific amount of gas flow for a specified period of time. In some embodiments, the etchant pulse duration is from about 1 to about 120 seconds. In some embodiments, the etchant pulse duration is from about 5 to about 30 seconds. In some embodiments, the etchant pulse duration is from about 1 to about 20 seconds. In some embodiments, the etchant flow rate is from about 50 to about 3,000 sccm.

In some embodiments, operation 104 is a thermal process, wherein the etchant is delivered to the process chamber in gas form. In other embodiments, the etchant may be delivered to the process chamber in plasma form. The etchant plasma may include reactive species such as electrons, positive ions, neutral species, radicals and other plasma species. In some embodiments, the etchant is a halide etchant such as hydrogen bromide or hydrogen chloride; or a mixture of hydrogen and halogen such as hydrogen and chlorine ($Cl_2$) or hydrogen and bromine ($Br_2$).

Operation 104 can be done by using either a gentle plasma (high pressure, low power) or a thermal process while flowing a dry development etchant such as $BCl_3$ (boron trichloride) or other Lewis Acid. In some embodiments, $BCl_3$ is able to quickly remove the unexposed material, leaving behind a pattern of the exposed film that can be transferred into the underlying layers by plasma-based etch processes, for example conventional etch processes.

Plasma processes include transformer coupled plasma (TCP), inductively coupled plasma (ICP) or capacitively coupled plasma (CCP), employing equipment and techniques among those known in the art. For example, a process may be conducted at a pressure of >5 mT (e.g., >15 mT), at a power level of <1000 W (e.g., <500 W). Temperatures may be from 0 to 300° C. (e.g., 30 to 120° C.), at flow rate of 100 to 1000 standard cubic centimeters per minute (sccm), e.g., about 500 sccm, for from 1 to 3000 seconds (e.g., 10-600 seconds).

In thermal development processes, the substrate is exposed to dry development chemistry (e.g., a Lewis Acid) in a vacuum chamber (e.g., oven). Suitable chambers can include a vacuum line, a dry development chemistry gas (e.g., $BCl_3$) line, and heaters for temperature control. In some embodiments, the chamber interior can be coated with corrosion resistant films, such as organic polymers or inorganic coatings. One such coating is polytetrafluoroethylene ((PTFE), e.g., Teflon 1M). Such materials can be used in thermal processes of this technology without risk of removal by plasma exposure.

During the etchant pulse, the pressure of the process chamber may be from about 5 mTorr to about 1 Torr in some embodiments. In some embodiments, the pedestal temperature in the process chamber may be from about −60° C. to about 120° C. during the etchant pulse. Moreover, the etch selectivity can be tuned from between 5:1 to greater than 50:1 between the unexposed and EUV exposed photoresist by adjusting gas flow, hydrogen to halogen ratio, pressure, temperature or RF power.

In operation 106, an optional purge is performed after the exposure to etchant by flowing an inert carrier gas through the process chamber in some embodiments. Purge or carrier gases are selected to be non-reactive with the etchant. Gases such as helium, argon, nitrogen or combinations thereof may be utilized.

In operation 108, the resist etched in operation 104 is cleaned with a pulse of an oxidizing agent. The oxidizing agent is used to clear non-volatile byproducts which may be formed during the etchant pulse which create an undesirable etch stop on the resist. The non-volatile by-products are etch resistant residues, and can impede further processing. In some embodiments, the non-volatile byproducts are at the bottom of the unexposed photoresist. Treatment with oxidizing agent can render the non-volatile byproducts volatile, thus enabling further etching.

The oxidizing agent may be oxygen, ozone, hydrogen peroxide, water, nitrous oxide, nitric oxide, nitrogen dioxide, nitric acid, sulfur dioxide, chlorine, fluorine, bromine, iodine or a combination thereof. In some embodiments, the oxidizing agent is air; water and oxygen; or chlorine ($Cl_2$).

In some embodiments, operation 108 is a thermal process, wherein the oxidizing agent is delivered to the process chamber in gas form. In other embodiments, the oxidizing agent may be delivered to the process chamber in plasma form. The etchant plasma may include reactive species such as electrons, positive ions, neutral species, radicals and other plasma species.

In some embodiments, operation 108 occurs at a higher temperature than operation 104. The elevated temperature may be achieved either by delivering the oxidizing agent as a hot gas, or by heating the pedestal in the process chamber to a second temperature higher than the first temperature utilized for operation 104. If delivered as a hot gas, the temperature of the gas may be from about 50° C. to about 250° C. If the pedestal of the process chamber is heated for the oxidizing agent pulse, the pedestal may be heated to a temperature of from about 20° C. to about 150° C.

In operation 108, an oxidizing agent is delivered as a pulse, for a certain duration of time at a certain flow rate. The duration of the pulse may be from about 1 to about 60 seconds. The ratio of oxidizing agent to etchant may be 1:1. In some embodiments, the oxidizing agent flow rate is from about 50 to about 3,000 sccm.

Figure 2:
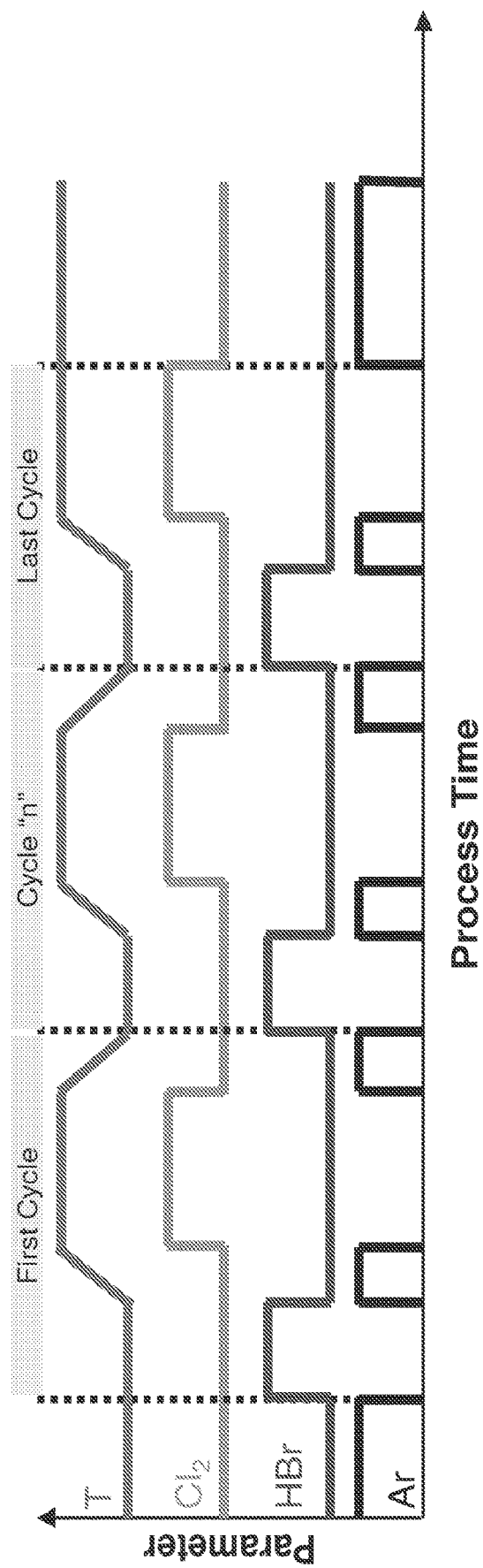
FIG. 2 illustrates a pulse sequence for a hydrogen bromide (HBr) etchant and a chlorine ($Cl_2$) oxidizing agent for developing a photoresist in accordance with certain disclosed embodiments.

Operation 108 and operation 104 are temporally separate pulses, meaning pulses separated in time. A pulse of etchant in operation 104 and a pulse of oxidizing agent delivered to the process chamber is one cycle. The cycle 114 can be repeated as many times as desired to effect complete byproduct removal. In addition, the etchant and oxidizing agent delivery for every cycle may have the same pulse duration; or the pulse durations may be varied after a specified number of cycles. The timing of the pulse sequencing of exemplary etchant HBr and exemplary oxidizing agent $Cl_2$ with optional argon purge with relationship to temperature is illustrated in graphically in FIG. 2.

Returning to FIG. 1, in operation 110, an optional purge may be performed after one cycle of operations 104 and operation 108 by flowing an inert carrier gas through the process chamber in some embodiments. Purge or carrier gases are selected to be non-reactive with the etchant. Gases such as helium, argon, nitrogen or combinations thereof may be utilized. If the optional purge is utilized after a cycle, the next cycle begins with exposure to an etchant as illustrated at 116.

In operation 112, a resist mask is formed. Plasma may be utilized to help harden the exposed photoresist.

In some instances, there may be residue or scum remaining after development. Residue may result from slower etching components in less homogeneous EUV resist formulations, including those applied by spin-coating techniques. Such scum may contain high metal concentrations, which may be problematic during subsequent pattern transfer.

Additionally, or alternatively, roughness may form after development on sidewalls of etched features in a developed pattern. Some of this may be attributed to stochastics or non-optimal Gaussian distribution of the light resulting in partially or fully exposed material in areas where the resist should remain unexposed or vice versa.

In some embodiments, dry development may be accompanied by a descum/smoothing operation. In some embodiments, a descumming and smoothing operation may be an inert gas plasma desorption operation. For example, the inert gas plasma desorption operation may be a helium plasma desorption operation. The inert gas plasma desorption operation may be performed after dry development or cycled with dry development.

Various embodiments include combining all dry operations by vapor deposition, EUV lithographic patterning, and dry development. Various other embodiments include a combination of wet and dry processing operations, for example, spin-on EUV photoresists (wet process) may be combined with dry development or other wet or dry processes as described herein. Also described are various post-deposition (or post-application) processes such as bevel and backside cleaning, chamber cleaning, descum, smoothing, and curing to modify and enhance film characteristics, and photoresist rework processing.

Figure 3A:
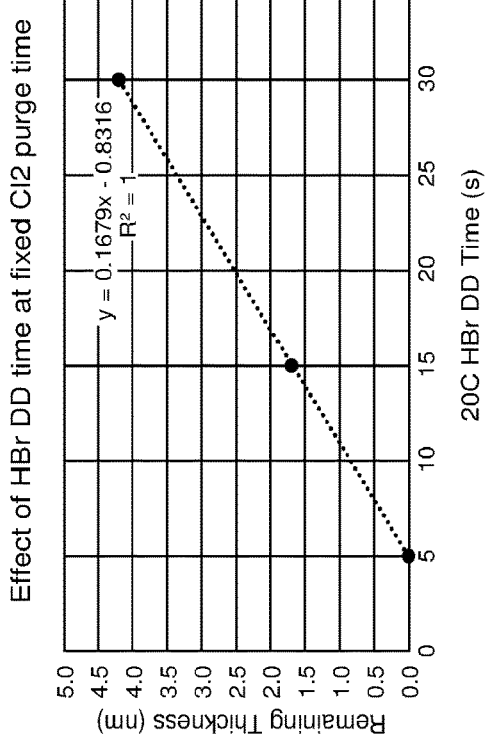
FIG. 3A shows a graph of chlorine oxidizing agent effect on residual byproduct thickness as temperature is varied in accordance with certain disclosed embodiments.
Figure 3B:
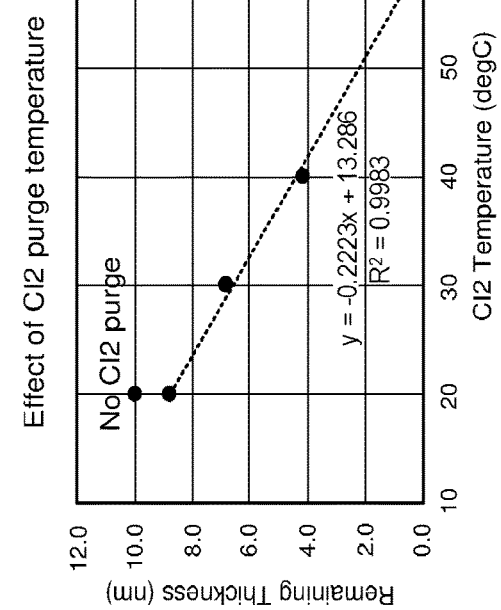
FIG. 3B shows a graph of hydrogen bromide etchant effect on residual byproduct thickness as the total exposure time of etchant is fixed but the etchant pulse duration of each cycle is varied in accordance with certain disclosed embodiments.
Figure 3C:
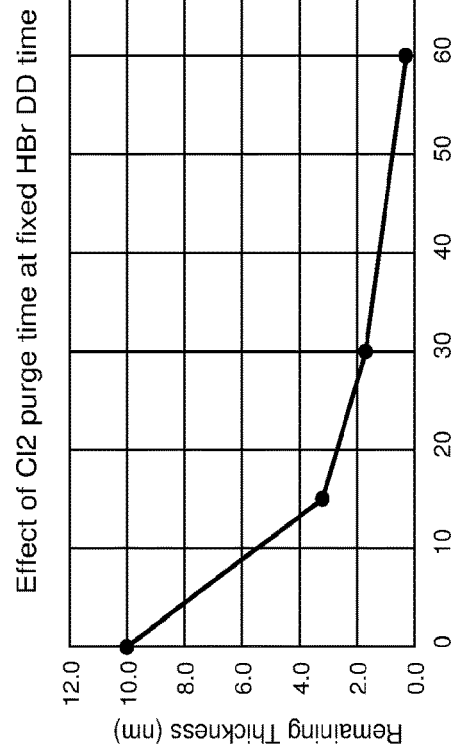
FIG. 3C shows a graph of chlorine oxidizing agent effect on residual byproduct thickness as oxidizing agent pulse duration is varied in accordance with certain disclosed embodiments.

FIGS. 3A-3C are graphical illustrations for some parameters of certain embodiments of the methods described herein. FIG. 3A demonstrates that without any oxidizing agent, etch stop occurs and a remaining thickness of an initial 25 nm thick EUV unexposed layer is 10 nm. Higher purge temperature of $Cl_2$ oxidizing agent is more effective for byproduct removal.

FIG. 3B illustrates that a shorter pulse of HBr etchant at a 20° C. process temperature with a greater number of cycles, in conjunction with $Cl_2$ oxidizing agent pulses in a cyclic dry development process leads to greater removal of byproducts.

FIG. 3C illustrates that longer $Cl_2$ oxidizing agent purge times at 40° C. process temperature, in conjunction with HBr etchant pulses in a cyclic dry development process, are more effective at reducing remaining thickness.

Figure 4:
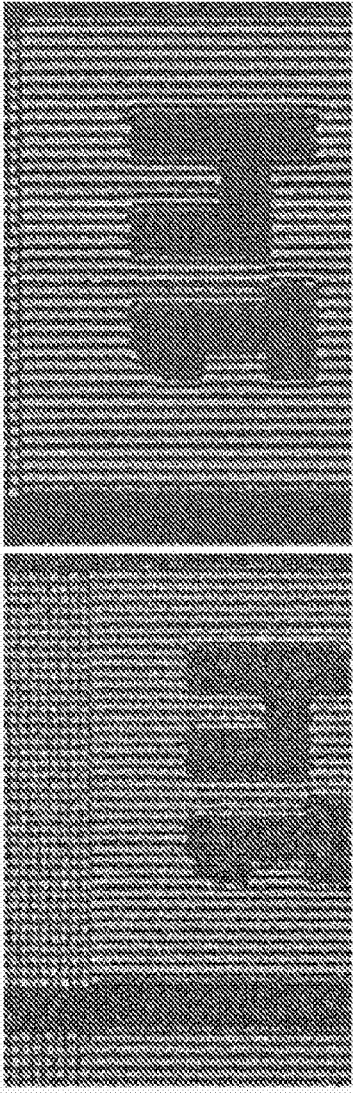
FIG. 4 shows scanning electron microscopy (SEM) images of a photopatterned substrate subjected to dry development with an etchant (single DD) in comparison to a photopatterned substrate subjected to cyclic dry development with etchant and chlorine oxidizing agent (cyclic DD) in accordance with certain disclosed embodiments.

FIG. 4 shows scanning electron microscopic images of patterned photoresist surfaces, comparing a conventional dry development utilizing only an etchant in comparison to a cyclic dry development process with sequential, alternating pulses of etchant and oxidizing agent. HBr etchant was utilized under the process conditions of: a 500 sccm flow rate, 300 mTorr pressure and 20° C. temperature. A cleaner unexposed area in both open and dense area and better edge roughness are achieved after applying 5 cycles of the cyclic dry development process.

Figure 5:
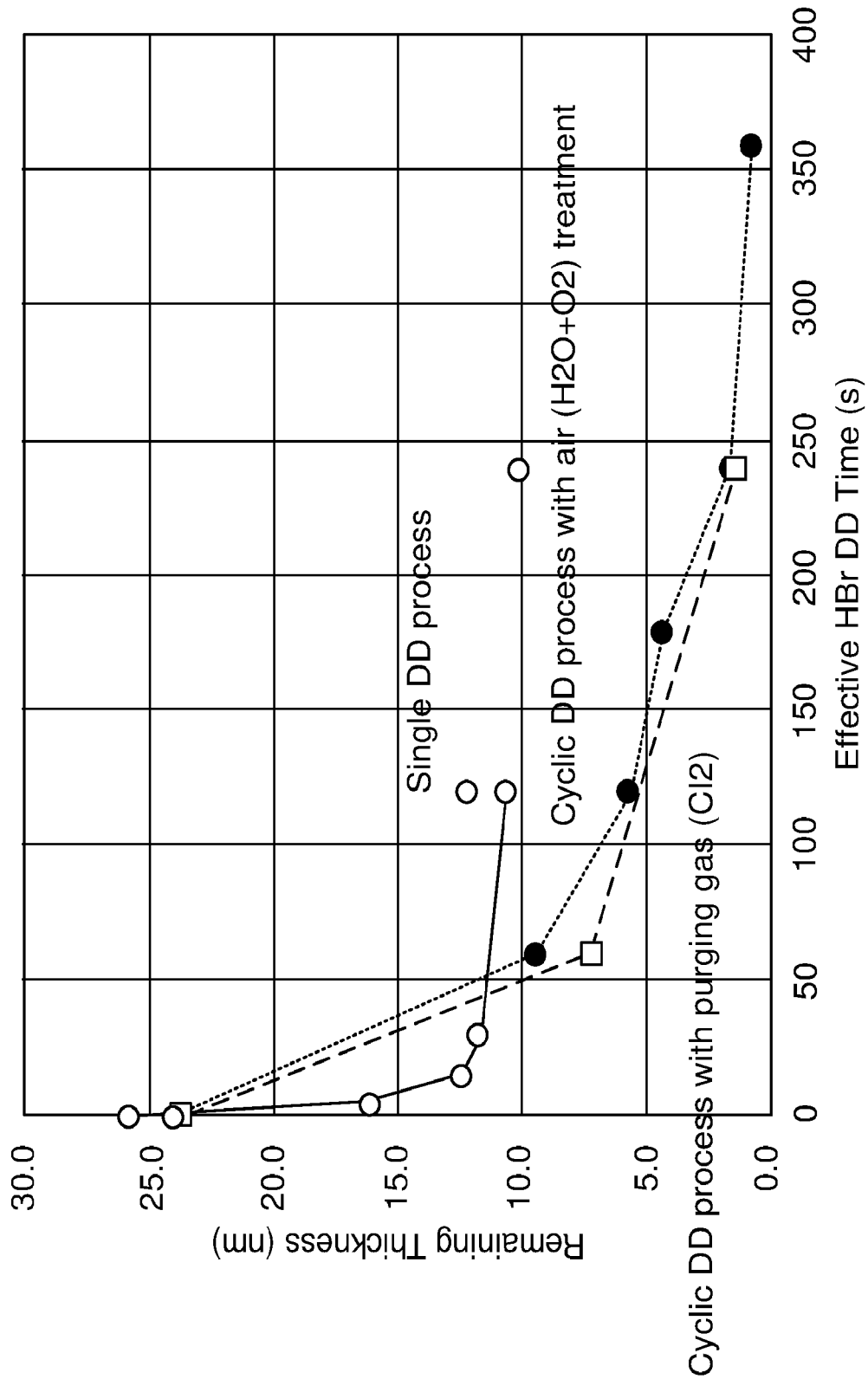
FIG. 5 shows a graphical comparison of the dry development with an etchant (single DD) in comparison to cyclic dry development with etchant and air oxidizing agent (cyclic DD) in accordance with certain disclosed embodiments.

FIG. 5 illustrates the limitations of a single dry development process (HBr etchant alone) versus the cyclic process. For a 25 nm unexposed photoresist film, etch stop occurs with slightly less than 15 nm of remaining thickness when etchant alone is utilized. By contrast, utilization of a cyclic process (240 seconds total time) results in far greater removal of the unexposed photoresist film with either $Cl_2$ or air oxidizing agent.

Figure 6:
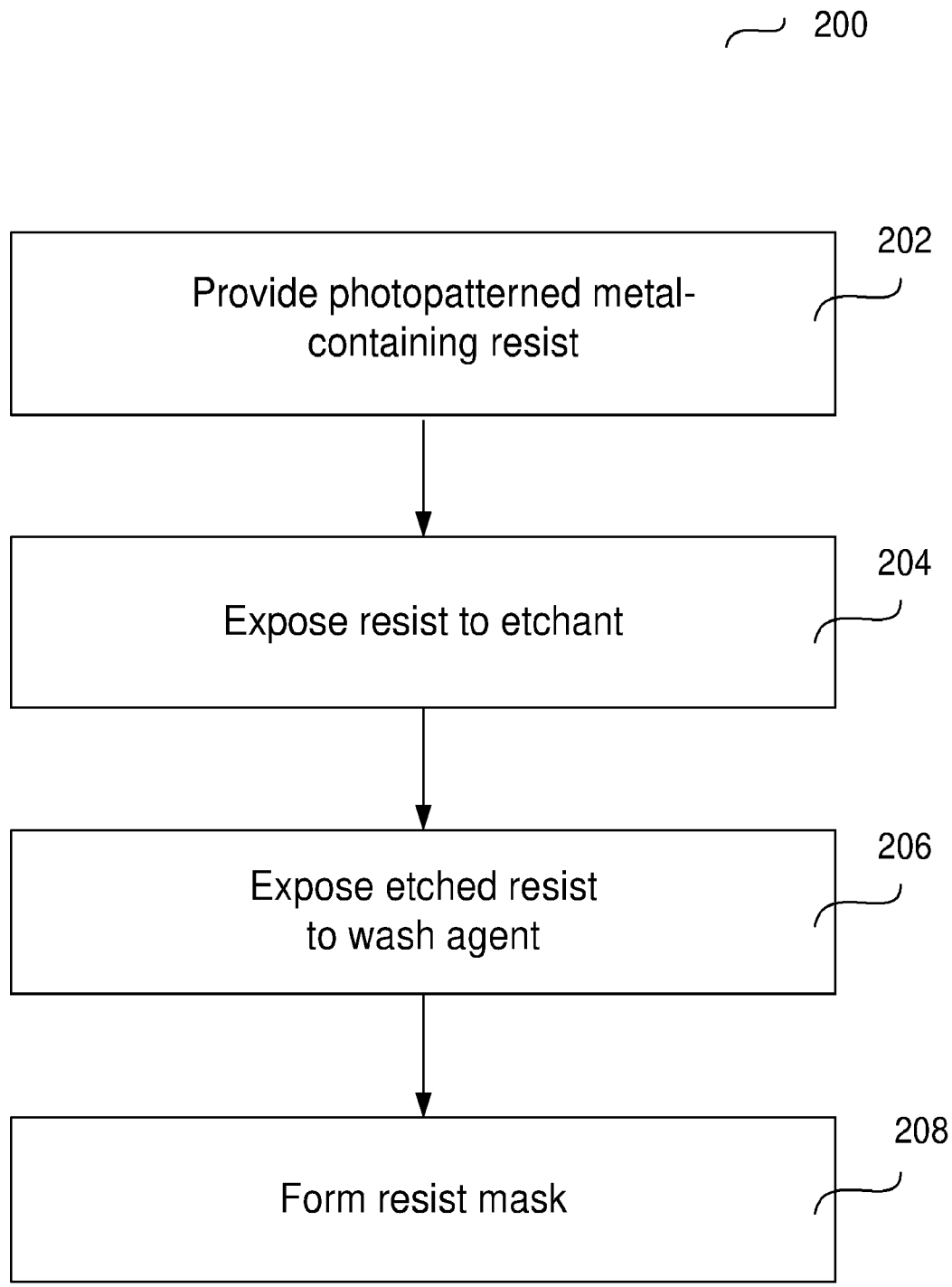
FIG. 6 presents a flow diagram of an example method for depositing and developing a photoresist utilizing an etchant in conjunction with a wash agent in accordance with certain disclosed embodiments.

FIG. 6 presents a flow diagram of an exemplary alternative method for depositing and developing a photoresist according to some embodiments. The operations of a process 200 may be performed in different orders and/or with different, fewer, or additional operations. One or more operations of the process 200 may be performed using an apparatus described in any one of FIGS. 7-10. In some embodiments, the operations of the process 200 may be implemented, at least in part, according to software stored in one or more non-transitory computer readable media.

In operation 202 of the process 200, a photopatterned metal containing resist is provided.

In operation 204, the photopatterned metal-containing resist is exposed to an etchant.

In operation 206, after treatment with etchant, a wash agent is utilized to dissolve any non-volatile byproducts. In some embodiments, the wash agent may be a suitable polar solvent such as water, methanol, ethanol, isopropanol, acetone, acetonitrile, tetrahydrofuran, dimethyl sulfide or a combination thereof. In some embodiments, the wash agent may be supercritical fluid, such as a low surface tension supercritical liquid. Suitable liquids include, but are not limited to, carbon dioxide, sulfur dioxide, dimethyl ether or a combination thereof.

During the cleaning process with a wash agent, the temperature of the pedestal in the process chamber is from about 10° C. to about 50° C. in some embodiments. In some embodiments, the process chamber pressure is from about 5 psi to about 3,000 psi during exposure to the wash agent.

In operation 208, a resist mask is formed. Plasma may be utilized to help harden the exposed photoresist, improve surface roughness and de-scum.

Process conditions for a descumming and smoothing operations may be controlled during or after development. In some embodiments, reactant flow may be between about 50 sccm and about 1000 sccm or between about 100 sccm and about 500 sccm, such as about 500 sccm He. In some embodiments, a temperature may be between about −60° C. and about 120° C., between about −20° C. and about 60° C., or between about 20° C. and about 40° C., such as about 20° C. In some embodiments, chamber pressure may be between about 1 mTorr and about 300 mTorr, between about 5 mTorr and about 100 mTorr, between about 5 mTorr and about 20 mTorr, such as about 10 mTorr. The plasma power may be relatively low with high ion energy. In some embodiments, plasma power may be between about 50 W and about 1000 W, between about 100 W and about 500 W, or between about 100 W and about 300 W, such as about 300 W. In some embodiments, the wafer bias is between about 10 V and about 500 V, between about 50 V and about 300 V, such as about 200 V. The plasma may be generated using a high RF frequency. In some embodiments, the RF frequency is 13.56 MHz. The duration of exposure to inert gas plasma may be relatively short so as to avoid excess exposure to UV radiation during plasma exposure. In some embodiments, the duration of exposure is between about 0.5 seconds and about 5 seconds, between about 1 second and about 3 seconds, such as about 2 seconds.

The inert gas plasma treatment for descumming and cleaning of the unexposed resist residue can have the collateral benefit of curing the exposed resist to harden it, thereby enhancing its hard mask function in subsequent operations to etch the underlying substrate. This resist hardening is achieved by exposure of the EUV exposed resist to UV radiation generated by the inert gas plasma, which may be continued after the descum/smoothing is complete with the bias turned off. The inert gas plasma curing may alternatively be performed if no descum/smoothing is needed or performed.

In some embodiments, inert gas plasma desorption descum and smoothing may be used with a wet development process. Wet development has very high selectivity and has been shown to exhibit clear on/off behavior, resulting in inability of a wet development process to remove areas exposed by "stray" EUV photons. The remaining residues are then left after the wet development process, resulting in scumming and high line edge and width roughness. Interestingly, due to the tunability of the dry development process in which the etch rate and selectivity can be tuned based on multiple knobs (e.g., time, temperature, pressure, gas/flow), inert gas plasma and/or dry development can be further applied to descum and smooth-metal containing resist lines by removing these partially exposed residues.

De-scumming and smoothing operations may be performed after wet development or dry development.

Apparatus

An apparatus of the present disclosure is configured for development of EUV resist. The apparatus may be configured to perform other processing operations such as deposition, bevel and backside cleaning, post-application baking, EUV scanning, post-exposure baking, photoresist reworking, descum, smoothing, curing, and other operations. In some embodiments, the apparatus is configured to perform all dry operations. In some embodiments, the apparatus is configured to perform all wet operations. In some embodiments, the apparatus is configured to perform a combination of wet and dry operations. The apparatus may include a single wafer chamber or multiple stations in the same process chamber. With multiple stations in the same process chamber, various processing operations such as those described in the present disclosure may be performed in different stations in the same process chamber. For instance, PEB thermal treatment may be performed in one station and development in another station.

The apparatus configured for development of EUV resist includes a process chamber with a substrate support. The apparatus may include a vacuum line coupled to the process chamber for pressure control and a development chemistry line coupled to the process chamber for delivery of development chemistry. In some embodiments, the development chemistry includes halide-containing gases or radicals of halide-containing gases. In some embodiments, the process chamber is a plasma-generating chamber or coupled to a plasma-generating chamber that functions as a remote plasma source. The plasma-generating chamber may be an ICP, TCP, or CCP reactor. The apparatus may include one or more heaters for temperature control. Such heaters may be provided in the process chamber and/or in the substrate support.

In some embodiments, the process chamber interior is coated with corrosion-resistant films, such as polymers or inorganic coatings. In one example, the process chamber interior is coated with anodized alumina. In another example, the process chamber interior is coated with yttrium oxide ($Y_2O_3$).

In some embodiments, the process chamber is made of an inexpensive material such as plastic. The process chamber does not have to necessarily be made of metal or ceramic. The plastic material may be sufficient to withstand halide-containing chemistries during development. Vacuum lines and/or development chemistry lines may be coupled to a plastic chamber.

In some embodiments, the substrate support may be used to process a substrate using a temperature distribution having radial and azimuthal components. The substrate support may include a plurality of independently controllable temperature control zones arranged in proximity to substrate locations above the temperature control zones. This allows the one or more heaters in a substrate support to more precisely and locally control temperature. The temperature control zones may be arranged in a defined pattern such as a rectangular grid, hexagonal grid, or other suitable pattern for generating a temperature profile as desired. In some embodiments, the temperature control zones may be spatially arranged in an electrostatic chuck to correct azimuthal non-uniformity or localized CD non-uniformity.

In some embodiments, the apparatus may further include a showerhead for delivery of one or more gases into the process chamber. In some embodiments, the showerhead may supply multiple separate gases to a reaction area while keeping the gases largely segregated within the showerhead. The showerhead may include multiple plenum volumes. This permits segregation of precursor gases, carrier gases, development gases, and cleaning gases, among other chemistries.

Removal of water or moisture from the process chamber may speed up the reaction of a photopatterned metal-containing EUV resist with development chemistry. In some embodiments, a cold trap may be coupled to the process chamber for removal of byproduct water vapor. The cold trap may condense the byproduct water vapor into liquid or solid form.

In some embodiments, the apparatus may further include a UV source such as a UV lamp and/or an IR source such as an IR lamp for resist curing and dehalogenation. The UV source and/or IR source may provide exposure to radiation to cure the EUV resist. Additionally or alternatively, the UV source may assist in photoactivation of development chemistries. Additionally or alternatively, the UV source may assist in halogen removal. Halogen residues may form on the semiconductor substrate or chamber surfaces that can be removed by UV exposure.

Figure 7:
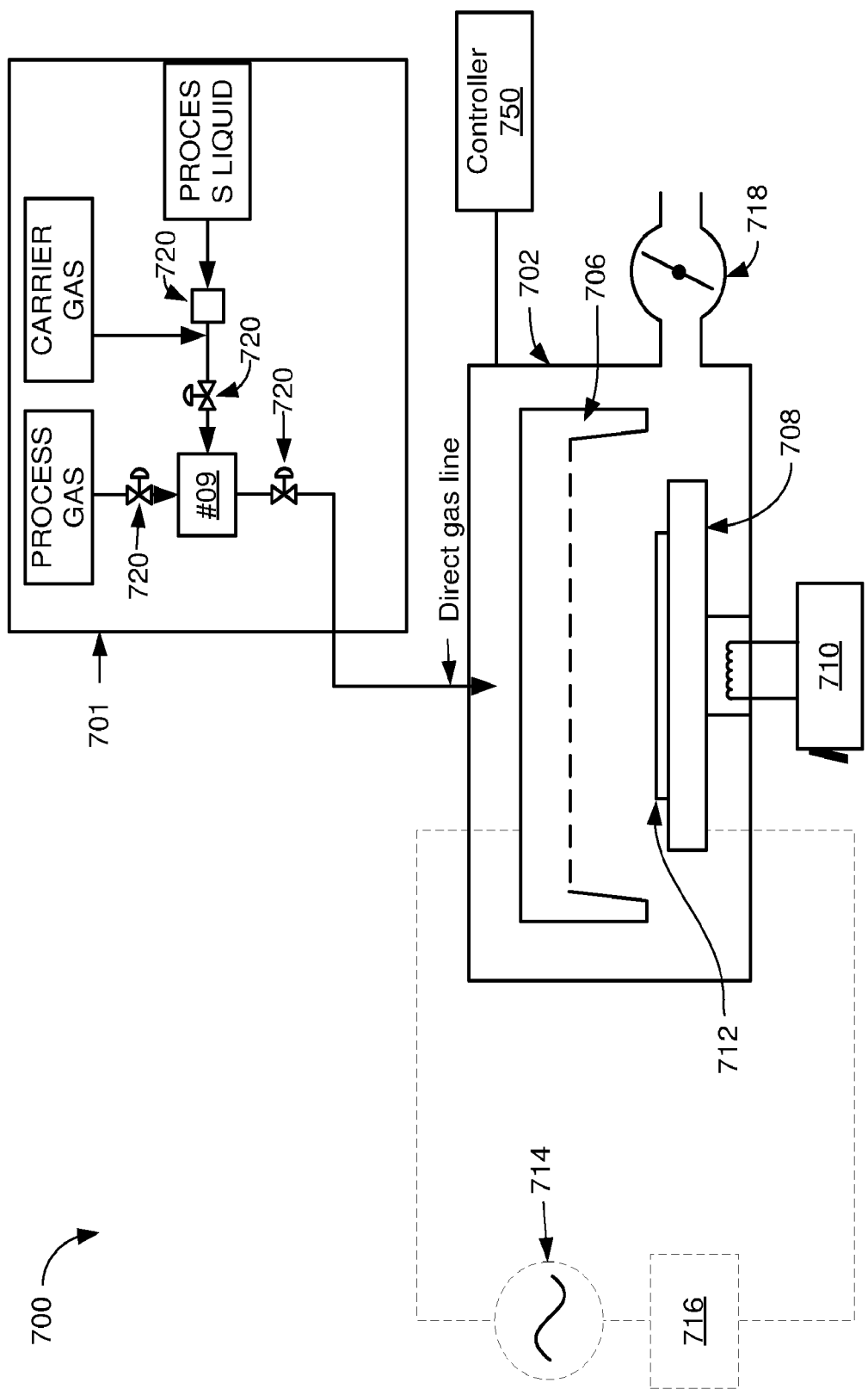
FIG. 7 depicts a schematic illustration of an example process station for maintaining a low-pressure environment that is suitable for performing the methods in accordance with certain disclosed embodiments.

FIG. 7 depicts a schematic illustration of an embodiment of process station 700 having a process chamber body 702 for maintaining a low-pressure environment that is suitable for embodiment of described dry development, clean, rework, descum and smoothing embodiments. A plurality of process stations 700 may be included in a common low-pressure process tool environment. In some embodiments, one or more hardware parameters of the process station 700 including those discussed in detail below may be adjusted programmatically by one or more computer controllers 750.

A process station may be configured as a module in a cluster tool. FIG. 10 depicts a semiconductor process cluster tool architecture with vacuum-integrated deposition and patterning modules suitable for implementation of the embodiments described herein. Such a cluster process tool architecture can include resist deposition, resist exposure (EUV scanner), resist development and etch modules, as described above and further below with reference to FIGS. 9 and 10.

In some embodiments, certain of the processing functions can be performed consecutively in the same module, for example dry development and etch. And embodiments of this disclosure are directed to methods and apparatus for receiving a wafer, including a photopatterned EUV resist thin film layer disposed on a layer or layer stack to be etched, to a dry development/etch chamber following photopatterning in an EUV scanner; dry developing photopatterned EUV resist thin film layer; and then etching the underlying layer using the patterned EUV resist as a mask, as described herein.

Returning to FIG. 7, process station 700 fluidly communicates with reactant delivery system 701 for delivering process gases to a distribution showerhead 706. Reactant delivery system 701 optionally includes a mixing vessel 704 for blending and/or conditioning process gases, for delivery to showerhead 706. One or more mixing vessel inlet valves 720 may control introduction of process gases to mixing vessel 704. Where plasma exposure is used, plasma may also be delivered to the showerhead 706 or may be generated in the process station 700. As noted above, in at least some embodiments, non-plasma thermal exposure is favored.

FIG. 7 includes an optional vaporization point 703 for vaporizing liquid reactant to be supplied to the mixing vessel 704. In some embodiments, a liquid flow controller (LFC) upstream of vaporization point 703 may be provided for controlling a mass flow of liquid for vaporization and delivery to process station 700. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM.

Showerhead 706 distributes process gases toward substrate 712. In the embodiment shown in FIG. 7, the substrate 712 is located beneath showerhead 706 and is shown resting on a pedestal 708. Showerhead 706 may have any suitable shape and may have any suitable number and arrangement of ports for distributing process gases to substrate 712.

In some embodiments, pedestal 708 may be raised or lowered to expose substrate 712 to a volume between the substrate 712 and the showerhead 706. It will be appreciated that, in some embodiments, pedestal height may be adjusted programmatically by a suitable computer controller 750. In some embodiments, the showerhead 706 may have multiple plenum volumes with multiple temperature controls.

In some embodiments, pedestal 708 may be temperature controlled via heater 710. In some embodiments, the pedestal 708 may be heated to a temperature of greater than 0° C. and up to 300° C. or more, for example 50 to 120° C., such as about 65 to 80° C., during non-plasma thermal exposure of a photopatterned resist to hydrogen halide dry development chemistry, such as HBr or HCl, as described in disclosed embodiments. In some embodiments, the heater 710 of the pedestal 708 may include a plurality of independently controllable temperature control zones.

Further, in some embodiments, pressure control for process station 700 may be provided by a butterfly valve 718. As shown in the embodiment of FIG. 7, butterfly valve 718 throttles a vacuum provided by a downstream vacuum pump (not shown). However, in some embodiments, pressure control of process station 700 may also be adjusted by varying a flow rate of one or more gases introduced to the process station 700.

In some embodiments, a position of showerhead 706 may be adjusted relative to pedestal 708 to vary a volume between the substrate 712 and the showerhead 706. Further, it will be appreciated that a vertical position of pedestal 708 and/or showerhead 706 may be varied by any suitable mechanism within the scope of the present disclosure. In some embodiments, pedestal 708 may include a rotational axis for rotating an orientation of substrate 712. It will be appreciated that, in some embodiments, one or more of these example adjustments may be performed programmatically by one or more suitable computer controllers 750.

Where plasma may be used, for example in gentle plasma-based dry development embodiments and/or etch operations conducted in the same chamber, showerhead 706 and pedestal 708 electrically communicate with a radio frequency (RF) power supply 714 and matching network 716 for powering a plasma. In some embodiments, the plasma energy may be controlled by controlling one or more of a process station pressure, a gas concentration, an RF source power, an RF source frequency, and a plasma power pulse timing. For example, RF power supply 714 and matching network 716 may be operated at any suitable power to form a plasma having a desired composition of radical species. Examples of suitable powers are up to about 500 W.

In some embodiments, instructions for a controller 750 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a recipe phase may include instructions for setting a flow rate of a dry development chemistry reactant gas, such as HBr or HCl, and time delay instructions for the recipe phase. In some embodiments, the controller 750 may include any of the features described below with respect to system controller 850 of FIG. 8.

Figure 8:
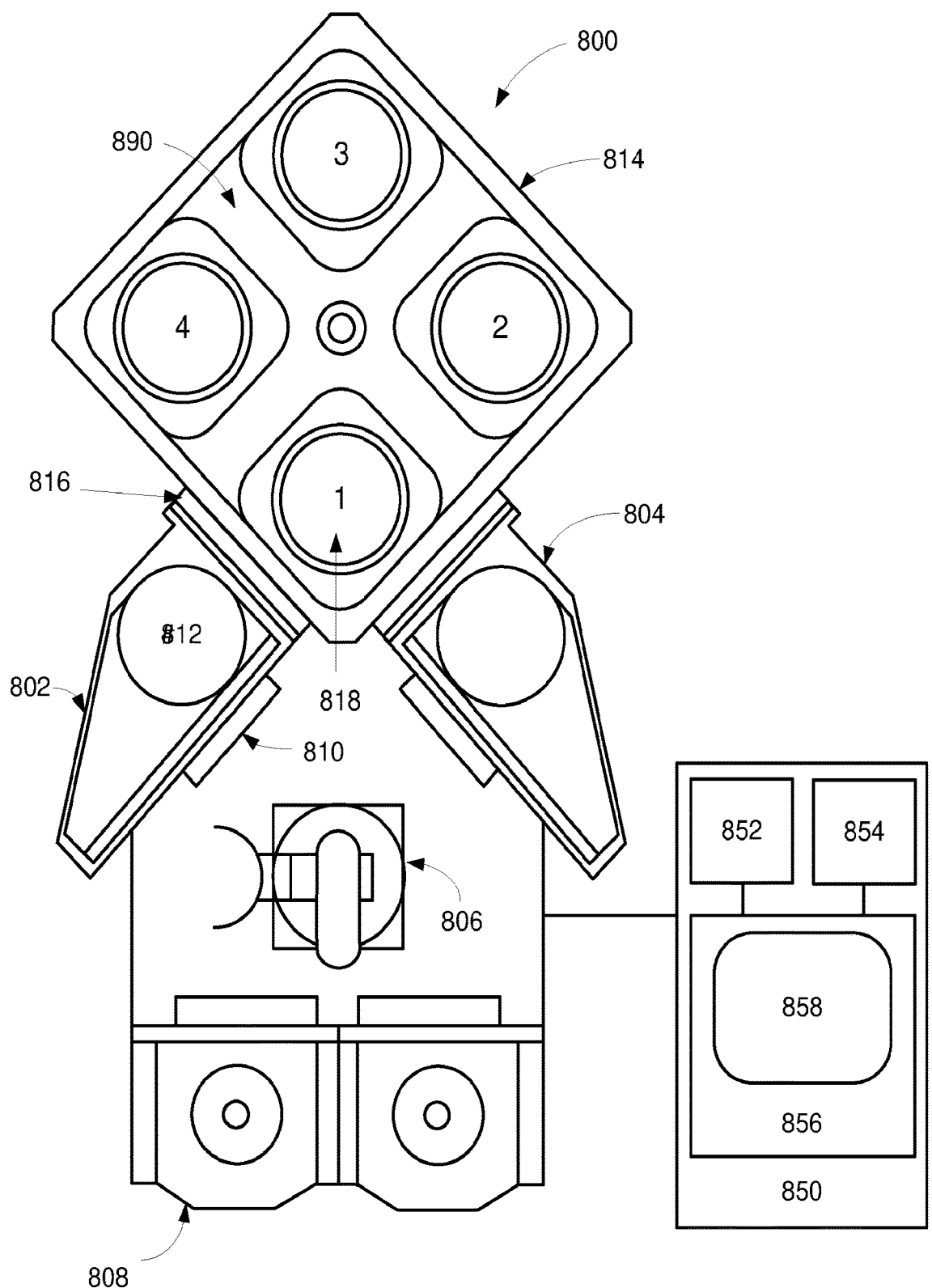
FIG. 8 depicts a schematic illustration of an example multi-station processing tool suitable for implementation of various operations in accordance with certain disclosed embodiments.

As described above, one or more process stations may be included in a multi-station processing tool. FIG. 8 shows a schematic view of an embodiment of a multi-station processing tool 800 with an inbound load lock 802 and an outbound load lock 804, either or both of which may include a remote plasma source. A robot 806 at atmospheric pressure is configured to move wafers from a cassette loaded through a pod 808 into inbound load lock 802 via an atmospheric port 810. A wafer is placed by the robot 806 on a pedestal 812 in the inbound load lock 802, the atmospheric port 810 is closed, and the load lock is pumped down. Where the inbound load lock 802 includes a remote plasma source, the wafer may be exposed to a remote plasma treatment to treat the silicon nitride surface in the load lock prior to being introduced into a processing chamber 814. Further, the wafer also may be heated in the inbound load lock 802 as well, for example, to remove moisture and adsorbed gases. Next, a chamber transport port 816 to processing chamber 814 is opened, and another robot (not shown) places the wafer into the reactor on a pedestal of a first station shown in the reactor for processing. While the embodiment depicted in FIG. 8 includes load locks, it will be appreciated that, in some embodiments, direct entry of a wafer into a process station may be provided.

The depicted processing chamber 814 includes four process stations, numbered from 1 to 4 in the embodiment shown in FIG. 8. Each station has a heated pedestal (shown at 818 for station 1), and gas line inlets. It will be appreciated that in some embodiments, each process station may have different or multiple purposes. For example, in some embodiments, a process station may be switchable between dry development and etch process modes. Additionally, or alternatively, in some embodiments, processing chamber 814 may include one or more matched pairs of dry development and etch process stations. While the depicted processing chamber 814 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 8 depicts an embodiment of a wafer handling system 890 for transferring wafers within processing chamber 814. In some embodiments, wafer handling system 890 may transfer wafers between various process stations and/or between a process station and a load lock. It will be appreciated that any suitable wafer handling system may be employed. Non-limiting examples include wafer carousels and wafer handling robots. FIG. 8 also depicts an embodiment of a system controller 850 employed to control process conditions and hardware states of process tool 800. System controller 850 may include one or more memory devices 856, one or more mass storage devices 854, and one or more processors 852. Processor 852 may include a CPU or computer, analog, and/or digital input/output connections, stepper motor controller boards, etc.

In some embodiments, system controller 850 controls all of the activities of process tool 800. System controller 850 executes system control software 858 stored in mass storage device 854, loaded into memory device 856, and executed on processor 852. Alternatively, the control logic may be hard coded in the controller 850. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 858 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 800. System control software 858 may be configured in any suitable way. For example, various process tool component subroutines or control objects may be written to control operation of the process tool components used to carry out various process tool processes. System control software 858 may be coded in any suitable computer readable programming language.

In some embodiments, system control software 858 may include input/output control (IOC) sequencing instructions for controlling the various parameters described above. Other computer software and/or programs stored on mass storage device 854 and/or memory device 856 associated with system controller 850 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 818 and to control the spacing between the substrate and other parts of process tool 800.

A process gas control program may include code for controlling halide-containing gas composition (e.g., HBr or HCl gas as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 850. The user interface may include a display screen, graphical software displays of the apparatus and/or process conditions, and user input devices such as pointing devices, keyboards, touch screens, microphones, etc.

In some embodiments, parameters adjusted by system controller 850 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 850 from various process tool sensors. The signals for controlling the process may be output on the analog and digital output connections of process tool 800. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 850 may provide program instructions for implementing the above-described deposition processes. The program instructions may control a variety of process parameters, such as DC power level, RF bias power level, pressure, temperature, etc. The instructions may control the parameters to operate development and/or etch processes according to various embodiments described herein.

The system controller 850 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 850.

In some embodiments, the system controller 850 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 850, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 850 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 850 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 850, in some embodiments, may be a part of or coupled to a computer that is integrated with, coupled to the system, otherwise networked to the system, or a combination thereof. For example, the system controller 850 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 850 receives instructions in the form of data, which specify parameters for each of the processing steps to be performed during one or more operations. It should be understood that the parameters may be specific to the type of process to be performed and the type of tool that the system controller 850 is configured to interface with or control. Thus, as described above, the system controller 850 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, an EUV lithography chamber (scanner) or module, a development chamber or module, and any other semiconductor processing systems that may be associated or used in the fabrication and/or manufacturing of semiconductor wafers.

As noted above, depending on the process step or steps to be performed by the tool, the system controller 850 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Inductively coupled plasma (ICP) reactors which, in certain embodiments, may be suitable for etch operations suitable for implementation of some embodiments, are now described. Although ICP reactors are described herein, in some embodiments, it should be understood that capacitively coupled plasma reactors may also be used.

Figure 9:
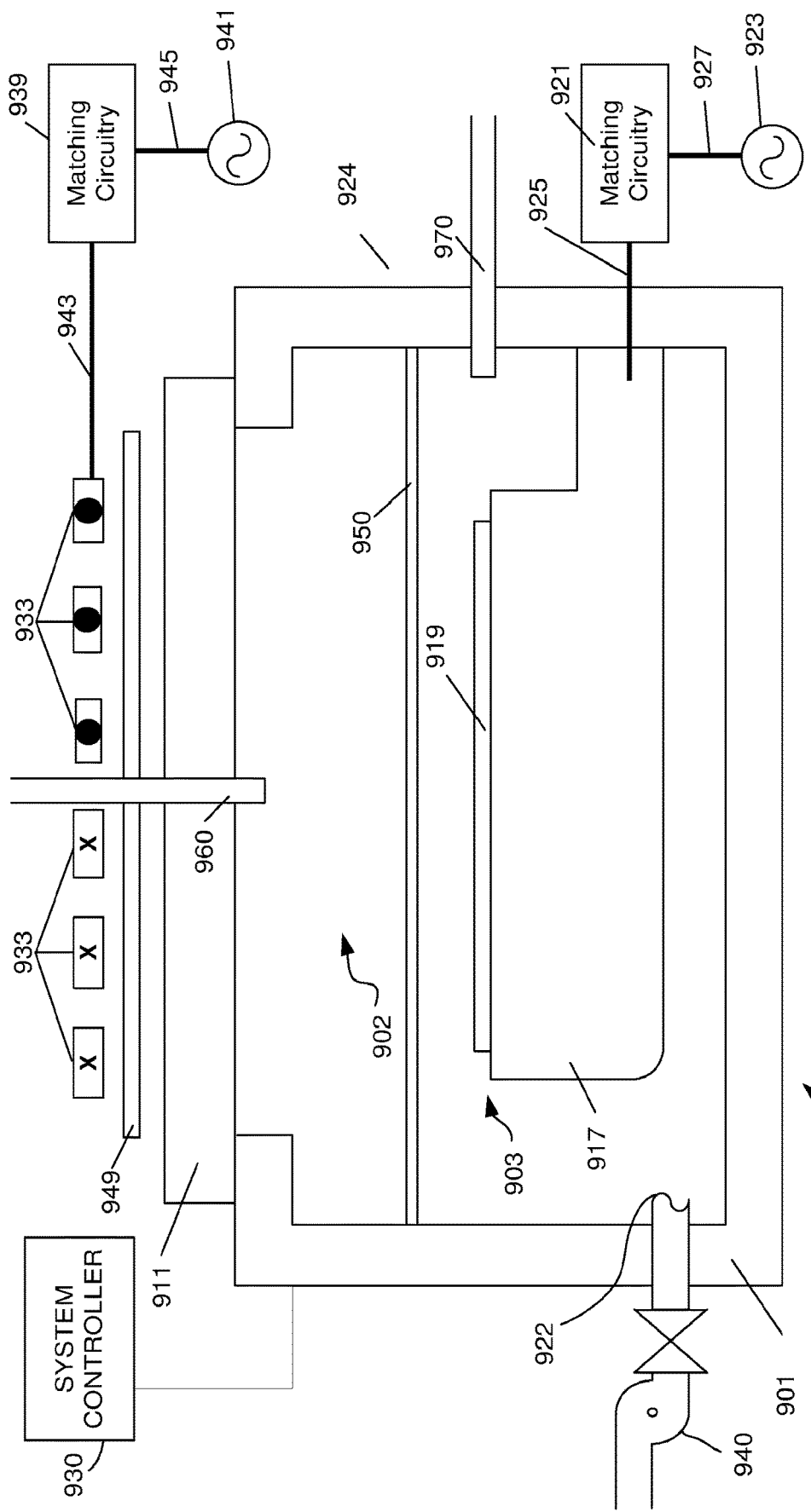
FIG. 9 shows a cross-sectional schematic view of an example inductively-coupled plasma apparatus for implementing certain operations in accordance with certain disclosed embodiments.
Figure 10:
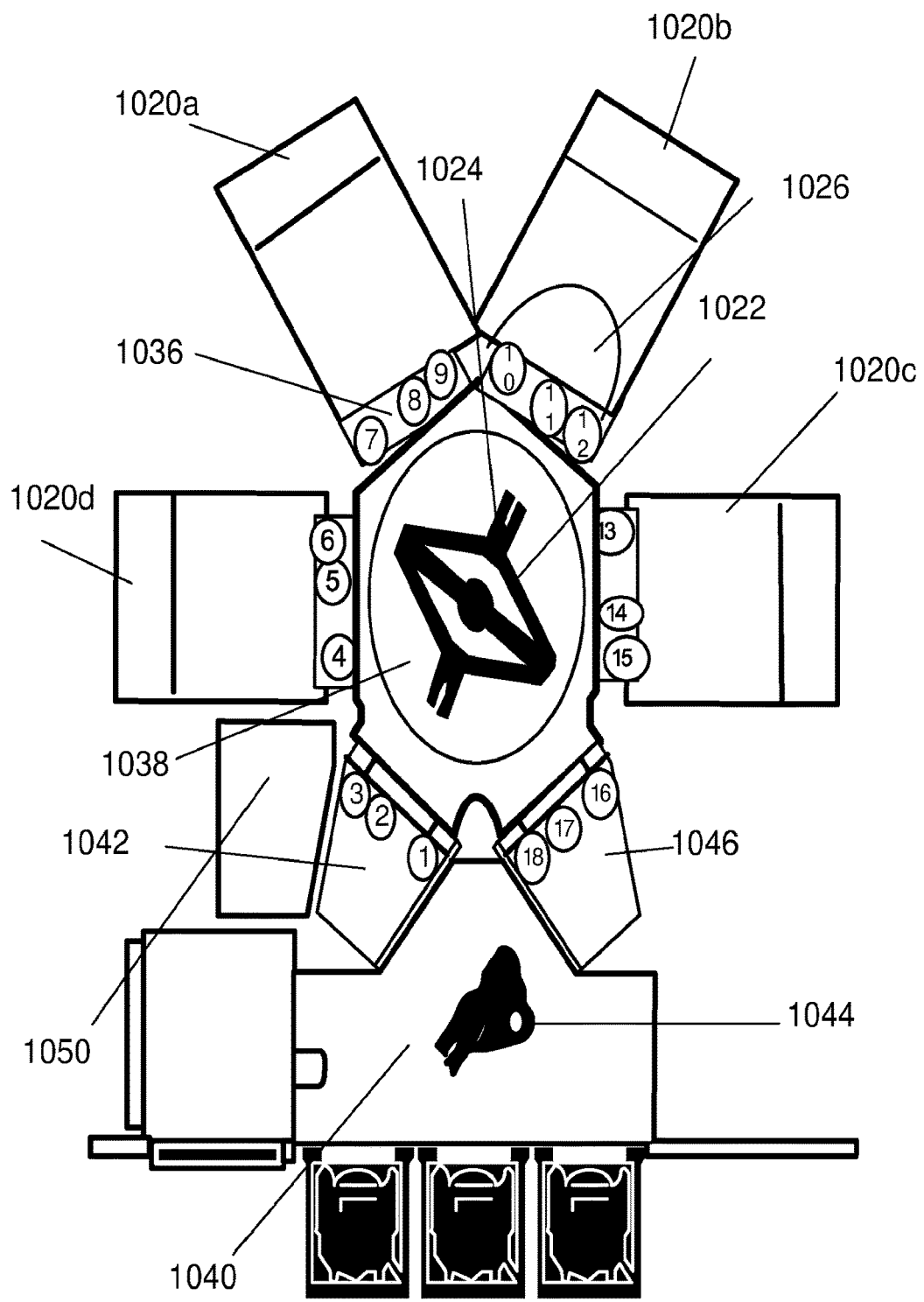
FIG. 10 depicts a semiconductor process cluster tool architecture with vacuum-integrated deposition and patterning modules that interface with a vacuum transfer module, suitable for implementations of methods in accordance with certain disclosed embodiments.

FIG. 9 schematically shows a cross-sectional view of an inductively coupled plasma apparatus 900 appropriate for implementing certain embodiments or aspects of embodiments such as dry development and/or etch. In other embodiments, other tools or tool types having the functionality to conduct the dry development and/or etch processes described herein may be used for implementation.

The inductively coupled plasma apparatus 900 includes an overall process chamber 924 structurally defined by chamber walls 901 and a window 911. The chamber walls 901 may be fabricated from stainless steel, aluminum, or plastic. The window 911 may be fabricated from quartz or other dielectric material. An optional internal plasma grid 950 divides the overall process chamber into an upper sub-chamber 902 and a lower sub chamber 903. In most embodiments, plasma grid 950 may be removed, thereby utilizing a chamber space made of sub chambers 902 and 903. A chuck 917 is positioned within the lower sub-chamber 903 near the bottom inner surface. The chuck 917 is configured to receive and hold a semiconductor wafer 919 upon which the etching and deposition processes are performed. The chuck 917 can be an electrostatic chuck for supporting the wafer 919 when present. In some embodiments, an edge ring (not shown) surrounds chuck 917 and has an upper surface that is approximately planar with a top surface of the wafer 919, when present over chuck 917. The chuck 917 also includes electrostatic electrodes for chucking and dechucking the wafer 919. A filter and DC clamp power supply (not shown) may be provided for this purpose. Other control systems for lifting the wafer 919 off the chuck 917 can also be provided. The chuck 917 can be electrically charged using an RF power supply 923. The RF power supply 923 is connected to matching circuitry 921 through a connection 927. The matching circuitry 921 is connected to the chuck 917 through a connection 925. In this manner, the RF power supply 923 is connected to the chuck 917. In various embodiments, a bias power of the electrostatic chuck may be set at about 50V or may be set at a different bias power depending on the process performed in accordance with disclosed embodiments. For example, the bias power may be between about 20 Vb and about 100 V, or between about 30 V and about 150 V.

Elements for plasma generation include a coil 933 is positioned above window 911. In some embodiments, a coil is not used in disclosed embodiments. The coil 933 is fabricated from an electrically conductive material and includes at least one complete turn. The example of a coil 933 shown in FIG. 9 includes three turns. The cross sections of coil 933 are shown with symbols, and coils having an "X" extend rotationally into the page, while coils having a "●" extend rotationally out of the page. Elements for plasma generation also include an RF power supply 941 configured to supply RF power to the coil 933. In general, the RF power supply 941 is connected to matching circuitry 939 through a connection 945. The matching circuitry 939 is connected to the coil 933 through a connection 943. In this manner, the RF power supply 941 is connected to the coil 933. An optional Faraday shield 949 is positioned between the coil 933 and the window 911. The Faraday shield 949 may be maintained in a spaced apart relationship relative to the coil 933. In some embodiments, the Faraday shield 949 is disposed immediately above the window 911. In some embodiments, the Faraday shield 949 is between the window 911 and the chuck 917. In some embodiments, the Faraday shield 949 is not maintained in a spaced apart relationship relative to the coil 933. For example, the Faraday shield 949 may be directly below the window 911 without a gap. The coil 933, the Faraday shield 949, and the window 911 are each configured to be substantially parallel to one another. The Faraday shield 949 may prevent metal or other species from depositing on the window 911 of the process chamber 924.

Process gases may be flowed into the process chamber through one or more main gas flow inlets 960 positioned in the upper sub-chamber 902 and/or through one or more side gas flow inlets 970. Likewise, though not explicitly shown, similar gas flow inlets may be used to supply process gases to a capacitively coupled plasma processing chamber. A vacuum pump, e.g., a one or two stage mechanical dry pump and/or turbomolecular pump 940, may be used to draw process gases out of the process chamber 924 and to maintain a pressure within the process chamber 924. For example, the vacuum pump may be used to evacuate the lower sub-chamber 903 during a purge operation of ALD. A valve-controlled conduit may be used to fluidically connect the vacuum pump to the process chamber 924 so as to selectively control application of the vacuum environment provided by the vacuum pump. This may be done employing a closed loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus 900, one or more process gases may be supplied through the gas flow inlets 960 and/or 970. In certain embodiments, process gas may be supplied only through the main gas flow inlet 960, or only through the side gas flow inlet 970. In some cases, the gas flow inlets shown in the figure may be replaced by more complex gas flow inlets, one or more showerheads, for example. The Faraday shield 949 and/or optional grid 950 may include internal channels and holes that allow delivery of process gases to the process chamber 924. Either or both of Faraday shield 949 and optional grid 950 may serve as a showerhead for delivery of process gases. In some embodiments, a liquid vaporization and delivery system may be situated upstream of the process chamber 924, such that once a liquid reactant or precursor is vaporized, the vaporized reactant or precursor is introduced into the process chamber 924 via a gas flow inlet 960 and/or 970.

Radio frequency power is supplied from the RF power supply 941 to the coil 933 to cause an RF current to flow through the coil 933. The RF current flowing through the coil 933 generates an electromagnetic field about the coil 933. The electromagnetic field generates an inductive current within the upper sub-chamber 902. The physical and chemical interactions of various generated ions and radicals with the wafer 919 etch features of and selectively deposit layers on the wafer 919.

If the plasma grid 950 is used such that there is both an upper sub-chamber 902 and a lower sub-chamber 903, the inductive current acts on the gas present in the upper sub-chamber 902 to generate an electron-ion plasma in the upper sub-chamber 902. The optional internal plasma grid 950 limits the amount of hot electrons in the lower sub-chamber 903. In some embodiments, the apparatus 900 is designed and operated such that the plasma present in the lower sub-chamber 903 is an ion-ion plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower sub-chamber 903 through port 922. The chuck 917 disclosed herein may operate at elevated temperatures ranging between about 10° C. and about 250° C. The temperature will depend on the process operation and specific recipe.

Apparatus 900 may be coupled to facilities (not shown) when installed in a clean room or a fabrication facility. Facilities include plumbing that provide processing gases, vacuum, temperature control, and environmental particle control. These facilities are coupled to apparatus 900, when installed in the target fabrication facility. Additionally, apparatus 900 may be coupled to a transfer chamber that allows robotics to transfer semiconductor wafers into and out of apparatus 900 using typical automation.

In some embodiments, a system controller 930 (which may include one or more physical or logical controllers) controls some or all of the operations of a process chamber 924. The system controller 930 may include one or more memory devices and one or more processors. In some embodiments, the apparatus 900 includes a switching system for controlling flow rates and durations when disclosed embodiments are performed. In some embodiments, the apparatus 900 may have a switching time of up to about 500 ms, or up to about 750 ms. Switching time may depend on the flow chemistry, recipe chosen, reactor architecture, and other factors.

In some embodiments, the system controller 930 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be integrated into the system controller 930, which may control various components or subparts of the system or systems. The system controller, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 930 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication or removal of one or more layers, materials, metals, oxides, silicon, silicon dioxide, surfaces, circuits, and/or dies of a wafer.

The system controller 930, in some embodiments, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet.

The remote computer may include a user interface that enables entry or programming of parameters and/or settings, which are then communicated to the system from the remote computer. In some examples, the system controller 930 receives instructions in the form of data, which specify parameters for each of the processing steps to be performed during one or more operations. It should be understood that the parameters may be specific to the type of process to be performed and the type of tool that the controller is configured to interface with or control. Thus, as described above, the system controller 930 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an ALE chamber or module, an ion implantation chamber or module, a track chamber or module, an EUV lithography chamber (scanner) or module, a dry development chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

EUVL patterning may be conducted using any suitable tool, often referred to as a scanner. The EUVL patterning tool may be a standalone device from which the substrate is moved into and out of for deposition and etching as described herein. Or, as described below, the EUVL patterning tool may be a module on a larger multi-component tool. FIG. 10 depicts a semiconductor process cluster tool architecture with vacuum-integrated deposition, EUV patterning and dry development/etch modules that interface with a vacuum transfer module, suitable for implementation of the processes described herein. While the processes may be conducted without such vacuum integrated apparatus, such apparatus may be advantageous in some embodiments.

FIG. 10 depicts a semiconductor process cluster tool architecture 1000 with vacuum-integrated deposition and patterning modules that interface with a vacuum transfer module, suitable for implementation of processes described herein. The arrangement of transfer modules to "transfer" wafers among multiple storage facilities and processing modules may be referred to as a "cluster tool architecture" system. Deposition and patterning modules are vacuum-integrated, in accordance with the requirements of a particular process. Other modules, such as for etch, may also be included on the cluster.

A vacuum transport module (VTM) 1038 interfaces with four processing modules 1020*a*-1020*d*, which may be individually optimized to perform various fabrication processes. By way of example, processing modules 1020*a*-1020*d* may be implemented to perform deposition, evaporation, ELD, dry development, etch, strip, and/or other semiconductor processes. For example, module 1020*a* may be an ALD reactor that may be operated to perform in a non-plasma, thermal atomic layer depositions as described herein. It should be understood that the figure is not necessarily drawn to scale.

Airlocks 1042 and 1046, also known as a loadlocks or transfer modules, interface with the VTM 1038 and a patterning module 1040. This tool architecture allows for work pieces, such as semiconductor substrates or wafers, to be transferred under vacuum so as not to react before exposure. Integration of the deposition modules with the lithography tool is facilitated by the fact that EUVL also requires a greatly reduced pressure given the strong optical absorption of the incident photons by ambient gases such as $H_2O$, $O_2$, etc.

As noted above, this integrated architecture is just one possible embodiment of a tool for implementation of the described processes. The processes may also be implemented with a more conventional stand-alone EUVL scanner and a deposition reactor, either stand alone or integrated in a cluster architecture with other tools, such as etch, strip etc., as modules, for example as described with reference to FIG. 10 but without the integrated patterning module.

Airlock 1042 may be an "outgoing" loadlock, referring to the transfer of a substrate out from the VTM 1038 serving a deposition module 1020*a* to the patterning module 1040, and airlock 1046 may be an "ingoing" loadlock, referring to the transfer of a substrate from the patterning module 1040 back in to the VTM 1038. The ingoing loadlock 1046 may also provide an interface to the exterior of the tool for access and egress of substrates. Each process module has a facet that interfaces the module to VTM 1038. For example, deposition process module 1020*a* has facet 1036. Inside each facet, sensors, for example, sensors 1-18 as shown, are used to detect the passing of wafer 1026 when moved between respective stations. Patterning module 1040 and airlocks 1042 and 1046 may be similarly equipped with additional facets and sensors, not shown.

Main VTM robot 1022 transfers wafer 1026 between modules, including airlocks 1042 and 1046. In one embodiment, robot 1022 has one arm, and in another embodiment, robot 1022 has two arms, where each arm has an end effector 1024 to pick wafers such as wafer 1026 for transport. Front-end robot 1044, in is used to transfer wafers 1026 from outgoing airlock 1042 into the patterning module 1040, from the patterning module 1040 into ingoing airlock 1046. Front-end robot 1044 may also transport wafers 1026 between the ingoing loadlock and the exterior of the tool for access and egress of substrates. Because ingoing airlock module 1046 has the ability to match the environment between atmospheric and vacuum, the wafer 1026 is able to move between the two pressure environments without being damaged.

It should be noted that a EUVL tool typically operates at a higher vacuum than a deposition tool. If this is the case, it is desirable to increase the vacuum environment of the substrate during the transfer between the deposition to the EUVL tool to allow the substrate to degas prior to entry into the patterning tool. Outgoing airlock 1042 may provide this function by holding the transferred wafers at a lower pressure, no higher than the pressure in the patterning module 1040, for a period of time and exhausting any off-gassing, so that the optics of the patterning tool 1040 are not contaminated by off-gassing from the substrate. A suitable pressure for the outgoing, off-gassing airlock is no more than 1E-8 Torr.

In some embodiments, a system controller 1050 (which may include one or more physical or logical controllers) controls some or all of the operations of the cluster tool and/or its separate modules. It should be noted that the controller can be local to the cluster architecture, or can be located external to the cluster architecture in the manufacturing floor, or in a remote location and connected to the cluster architecture via a network. The system controller 1050 may include one or more memory devices and one or more processors. The processor may include a central processing unit (CPU) or computer, analog and/or digital input/output connections, stepper motor controller boards, and other like components. Instructions for implementing appropriate control operations are executed on the processor. These instructions may be stored on the memory devices associated with the controller or they may be provided over a network. In certain embodiments, the system controller executes system control software.

The system control software may include instructions for controlling the timing of application and/or magnitude of any aspect of tool or module operation. System control software may be configured in any suitable way. For example, various process tool component subroutines or control objects may be written to control operations of the process tool components necessary to carry out various process tool processes. System control software may be coded in any suitable compute readable programming language. In some embodiments, system control software includes input/output control (IOC) sequencing instructions for controlling the various parameters described above. For example, each phase of a semiconductor fabrication process may include one or more instructions for execution by the system controller. The instructions for setting process conditions for condensation, deposition, evaporation, patterning and/or etching phase may be included in a corresponding recipe phase, for example.

In various embodiments, an apparatus for forming a negative pattern mask is provided. The apparatus may include a processing chamber for patterning, deposition and etch, and a controller including instructions for forming a negative pattern mask. The instructions may include code for, in the processing chamber, patterning a feature in a chemically amplified (CAR) resist on a semiconductor substrate by EUV exposure to expose a surface of the substrate, developing the photopatterned resist, and etching the underlying layer or layer stack using the patterned resist as a mask. Development may be performed using a halide-containing chemistry.

It should be noted that the computer controlling the wafer movement can be local to the cluster architecture, or can be located external to the cluster architecture in the manufacturing floor, or in a remote location and connected to the cluster architecture via a network. A controller as described above with respect to any of FIG. 7, 8 or 9 may be implemented with the tool in FIG. 10.

CONCLUSION

It is understood that the examples and embodiments described herein are for illustrative purposes only and that various modifications or changes in light thereof will be suggested to persons skilled in the art. Although various details have been omitted for clarity's sake, various design alternatives may be implemented. Therefore, the present examples are to be considered as illustrative and not restrictive, and the disclosure is not to be limited to the details given herein, but may be modified within the scope of the disclosure.

What is claimed is:

1. A method of processing a semiconductor substrate comprising:
providing a photopatterned metal-containing resist on a semiconductor substrate on a pedestal in a process chamber; and
dry developing the photopatterned metal-containing resist by selectively removing a portion of the photopatterned metal-containing resist by exposing the photopatterned metal-containing resist to at least two cycles comprising a pulse of an etchant and a pulse of a halogen-free oxidizing agent, delivered alternately, to form a resist mask, wherein the pulse of the halogen-free oxidizing agent removes non-volatile byproducts formed by the pulse of the etchant.

2. The method of claim 1, wherein the pulse of the etchant and the pulse of the halogen-free oxidizing agent are temporally separate.

3. The method of claim 1, wherein the pedestal is at a first temperature during the pulse of the etchant; and the halogen-free oxidizing agent is delivered to the process chamber at a second temperature.

4. The method of claim 3, wherein the first temperature is from about −60° C. to about 120° C.

5. The method of claim 3, wherein the second temperature is from about 50° C. to about 250° C.

6. The method of claim 1, wherein the pedestal is at a first temperature during the pulse of the etchant and the pedestal is at a second temperature during the pulse of the halogen-free oxidizing agent.

7. The method of claim 6, wherein the second temperature is from about 20° C. to about 150° C.

8. The method of claim 1, wherein a duration of the pulse of the etchant is from about 1 to about 120 seconds and a duration of the pulse of the halogen-free oxidizing agent is from about 1 to about 120 seconds.

9. The method of claim 1, wherein the photopatterned metal-containing resist comprises an organo-metal oxide, a metal, a metal oxide or an organo-metal.

10. The method of claim 9, wherein the metal oxide comprises a tin oxide.

11. The method of claim 1, wherein the etchant is a halide etchant.

12. The method of claim 11, wherein the halide etchant comprises a hydrogen halide, hydrogen gas and halogen gas, an organic halide, an acyl halide, a carbonyl halide, a thionyl halide or a combination thereof.

13. The method of claim 11, wherein the halide etchant comprises hydrogen fluoride, hydrogen chloride, boron trichloride, hydrogen bromide, hydrogen iodide or a combination thereof.

14. The method of claim 1, wherein the etchant comprises an etchant plasma.

15. The method of claim 14, wherein the etchant plasma is generated remotely.

16. The method of claim 1, wherein the halogen-free oxidizing agent comprises oxygen, ozone, hydrogen peroxide, water, nitrous oxide, nitric oxide, nitrogen dioxide, nitric acid, sulfur dioxide, or a combination thereof.

17. The method of claim 16, wherein the halogen-free oxidizing agent is a gaseous oxidizing agent comprising water and oxygen.

18. The method of claim 1, wherein the halogen-free oxidizing agent comprises a halogen-free oxidizing agent plasma.

19. The method of claim 18, wherein the halogen-free oxidizing agent plasma is generated remotely.

20. The method of claim 1, further comprising exposing the photopatterned metal-containing resist to an inert plasma gas.

21. The method of claim 1, further comprising purging the process chamber with an inert gas between the pulse of the etchant and the pulse of the halogen-free oxidizing agent or after a cycle of a pulse of the etchant and a pulse of the halogen-free oxidizing agent.

22. The method of claim 1, wherein each cycle has the same etchant pulse duration.

23. A method of promoting atomic layer etching on a substrate comprising:
  providing a photopatterned metal-containing resist on a semiconductor substrate on a pedestal in a process chamber; and
  dry developing the photopatterned metal-containing resist by selectively removing a portion of the resist by exposing the photopatterned metal-containing resist to at least two cycles comprising a pulse of an etchant and a pulse of a halogen-free oxidizing agent, delivered alternately, to form a resist mask;
  whereby etch stop due to non-volatile byproducts of the etchant pulse is eliminated.

24. A method of processing a semiconductor substrate, the method comprising:
  providing a dry-deposited photopatterned metal oxide EUV resist on a semiconductor substrate on a pedestal in a process chamber; and
  dry developing the photopatterned metal oxide EUV resist by selectively removing an EUV-unexposed portion of the EUV resist by exposure to at least two cycles comprising a pulse of an etchant and a pulse of a halogen-free oxidizing agent, delivered alternately, to form a resist hard mask, wherein the pulse of the halogen-free oxidizing agent removes non-volatile byproducts formed by the pulse of the etchant.

25. An apparatus for conducting development of resist, the apparatus comprising:
  a process chamber with a substrate support;
  a vacuum line coupled to the process chamber;
  etchant and oxidizing agents lines coupled to the process chamber; and
  a controller configured with instructions for processing a semiconductor substrate, the instructions comprising code for:
    providing a photopatterned metal-containing resist on a semiconductor substrate in a process chamber; and
    dry developing the photopatterned metal-containing resist by selectively removing a portion of the resist by exposure to at least two cycles comprising an etchant pulse and a halogen-free oxidizing agent pulse, delivered alternately, to form a resist mask.

26. The apparatus of claim 25, wherein the photopatterned metal-containing resist is a photopatterned metal-containing EUV resist, and wherein the controller configured with instructions comprising code for dry developing the photopatterned metal-containing EUV resist comprises code for selectively removing an EUV-unexposed portion of the EUV resist relative to an EUV-exposed portion with at least two cycles comprising an etchant pulse and a halogen-free oxidizing agent pulse, delivered alternately, to form the resist mask.

27. The apparatus of claim 25, further comprising:
  one or more heaters coupled to the substrate support, wherein the one or more heaters include a plurality of independently controllable temperature control zones.

28. The apparatus of claim 27, further comprising heated oxidizing agent delivery lines.

* * * * *